(12) United States Patent
Dutta et al.

(10) Patent No.: US 9,013,928 B1
(45) Date of Patent: Apr. 21, 2015

(54) DYNAMIC BIT LINE BIAS FOR PROGRAMMING NON-VOLATILE MEMORY

(71) Applicant: SanDisk Technologies Inc., Plano, TX (US)

(72) Inventors: Deepanshu Dutta, San Jose, CA (US); Ken Oowada, Fujisawa (JP); Masaaki Higashitani, Cupertino, CA (US); Man L. Mui, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/561,841

(22) Filed: Dec. 5, 2014

Related U.S. Application Data

(63) Continuation of application No. 13/660,203, filed on Oct. 25, 2012, now Pat. No. 8,953,386.

(51) Int. Cl.
G11C 16/04 (2006.01)
G11C 16/10 (2006.01)
G11C 16/34 (2006.01)

(52) U.S. Cl.
CPC ............ *G11C 16/10* (2013.01); *G11C 16/3459* (2013.01)

(58) Field of Classification Search
USPC ........................................ 365/185.28, 185.19
See application file for complete search history.

(56) References Cited

U.S. PATENT DOCUMENTS

| | | | |
|---|---|---|---|
| 7,023,737 B1 | 4/2006 | Wan et al. | |
| 7,324,383 B2 | 1/2008 | Incarnati et al. | |
| 7,978,526 B2 | 7/2011 | Nguyen et al. | |
| 8,116,131 B2 | 2/2012 | Park et al. | |
| 2009/0010068 A1 | 1/2009 | Lee | |
| 2010/0124109 A1* | 5/2010 | Honma et al. | 365/185.03 |
| 2010/0329005 A1 | 12/2010 | Yang | |
| 2010/0329013 A1* | 12/2010 | Shikata et al. | 365/185.18 |
| 2011/0122692 A1 | 5/2011 | Dutta et al. | |
| 2012/0014184 A1 | 1/2012 | Dutta et al. | |
| 2012/0033500 A1 | 2/2012 | Dutta et al. | |
| 2012/0044769 A1 | 2/2012 | Yip | |
| 2012/0163083 A1 | 6/2012 | Dutta et al. | |
| 2014/0119126 A1 | 5/2014 | Dutta et al. | |

FOREIGN PATENT DOCUMENTS

WO    WO2008/045805 A1    4/2008

OTHER PUBLICATIONS

Notice of Allowance dated Sep. 23, 2014, U.S. Appl. No. 13/660,203, filed Oct. 25, 2012.

International Search Report & The Written Opinion of the Internatinal Searching Authority dated Jan. 28, 2014, International Application No. PCT/US2013/065969.

* cited by examiner

*Primary Examiner* — Vu Le

(74) *Attorney, Agent, or Firm* — Vierra Magen Marcus LLP

(57) ABSTRACT

A program operation for a set of non-volatile storage elements. A count is maintained of a number of program pulses which are applied to an individual storage element in a slow programming mode, and an associated bit line voltage is adjusted based on the count. Different bit line voltages can be used, having a common step size or different steps sizes. As a result, the change in threshold voltage of the storage element within the slow programming mode, with each program pulse can be made uniform, resulting in improved programming accuracy. Latches maintain the count of program pulses experienced by the associated storage element, while in the slow programming mode. The storage element is in a fast programming mode when its threshold voltage is below a lower verify level, and in the slow programming mode when its threshold voltage is between the lower verify level and a higher verify level.

20 Claims, 16 Drawing Sheets

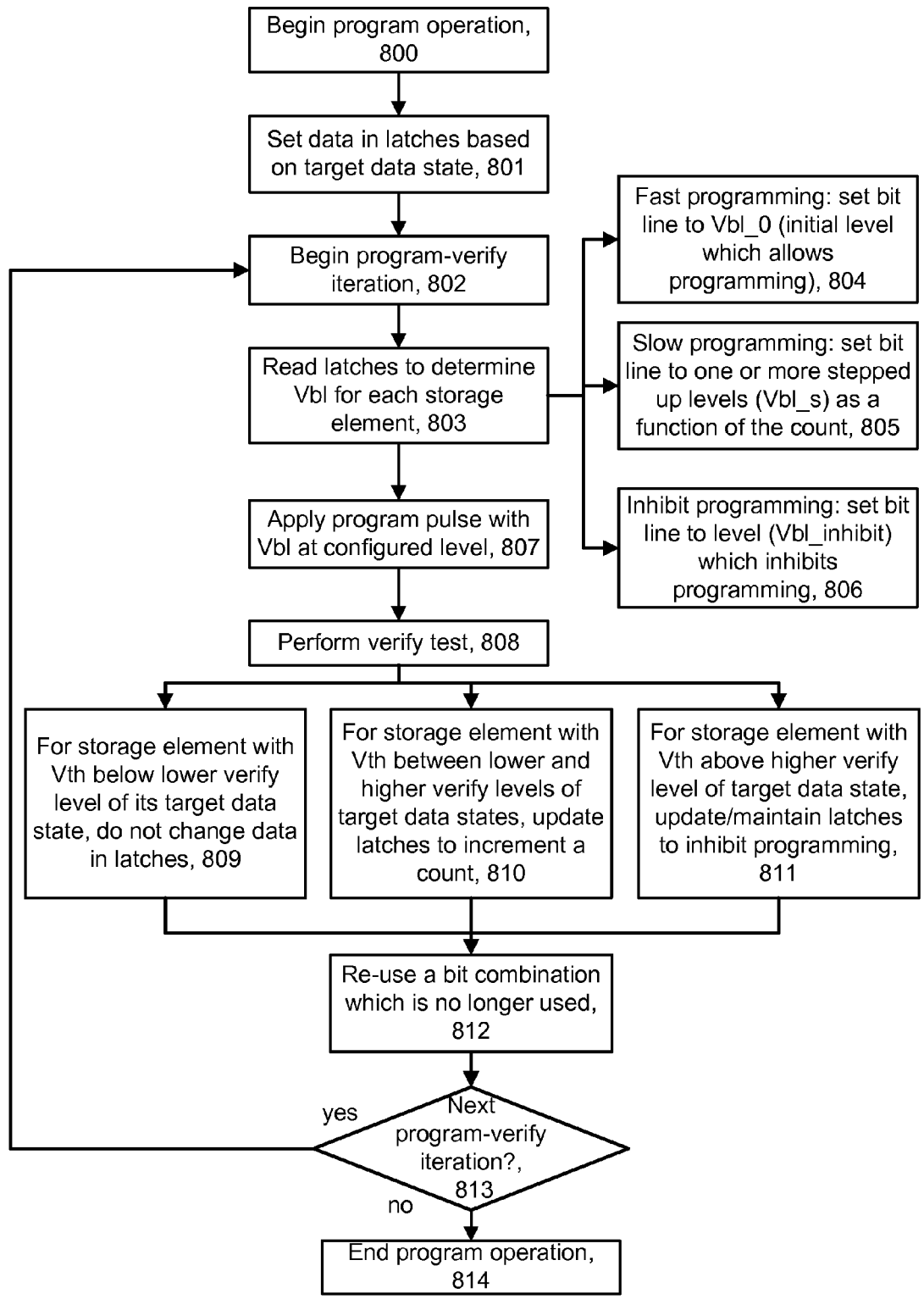

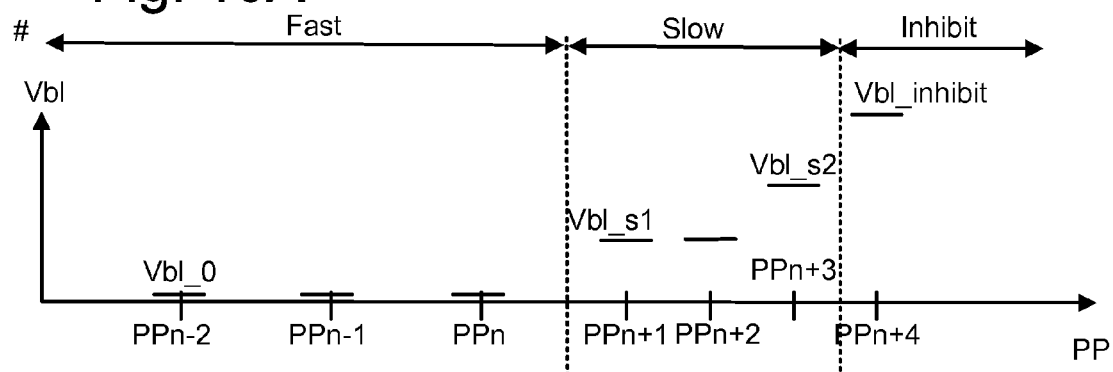
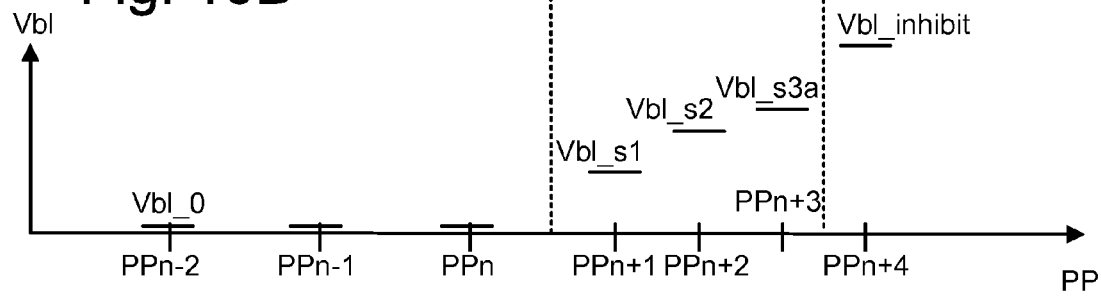

Fig. 13

| Latch: | Er | A | Aqpw | Ainh | B | Bqpw | Binh | C | Cqpw | Cinh |
|---|---|---|---|---|---|---|---|---|---|---|
| QPW1 | 1 | 0 | 1 | 1 | 0 | 1 | 1 | 0 | 1 | 1 |
| UP | 1 | 0 | 0 | 1 | 0 | 0 | 1 | 1 | 1 | 1 |
| LP | 1 | 1 | 1 | 1 | 0 | 0 | 1 | 0 | 0 | 1 |

Fig. 14A

| Latch: | Er | A | Aqpw | Ainh | B | Bqpw1 | Bqpw2 | Binh | C | Cqpw | Cinh |
|---|---|---|---|---|---|---|---|---|---|---|---|
| QPW1 | 1 | 0 | 1 | 1 | 0 | 1 | 1 | 1 | 0 | 1 | 1 |
| UP | 1 | 0 | 0 | 1 | 0 | 0 | 0 | 1 | 1 | 1 | 1 |
| LP | 1 | 1 | 1 | 1 | 0 | 0 | 1 | 1 | 0 | 0 | 1 |

Fig. 14B

| Latch: | Er | A | Aqpw | Ainh | B | Bqpw1 | Binh | C | Cqpw1 | Cqpw2 | Cinh |
|---|---|---|---|---|---|---|---|---|---|---|---|
| QPW1 | 1 | 0 | 1 | 1 | 0 | 1 | 1 | 0 | 1 | 1 | 1 |
| UP | 1 | 0 | 0 | 1 | 0 | 0 | 1 | 1 | 1 | 0 | 1 |
| LP | 1 | 1 | 1 | 1 | 0 | 0 | 1 | 0 | 0 | 1 | 1 |

Fig. 15A

| Latch: | Er | A | Aqpw1 | Aqpw2 | Aqpw3 | Ainh | B | Bqpw1 | Bqpw2 | Bqpw3 | Binh |
|---|---|---|---|---|---|---|---|---|---|---|---|
| QPW2 | 1 | 0 | 0 | 1 | 1 | 1 | 0 | 0 | 1 | 1 | 1 |
| QPW1 | 1 | 0 | 1 | 1 | 0 | 1 | 0 | 1 | 1 | 0 | 1 |
| UP | 1 | 0 | 0 | 0 | 0 | 1 | 0 | 0 | 0 | 0 | 1 |
| LP | 1 | 1 | 1 | 1 | 1 | 1 | 0 | 0 | 0 | 0 | 1 |

Fig. 15B

| Latch: | C | Cqpw1 | Cqpw2 | Cqpw3 | Cinh |
|---|---|---|---|---|---|
| QPW2 | 0 | 0 | 1 | 1 | 1 |
| QPW1 | 0 | 1 | 1 | 0 | 1 |
| UP | 1 | 1 | 1 | 1 | 1 |
| LP | 0 | 0 | 0 | 0 | 1 |

Fig. 15C

| Latch: | Er | A | Aqpw1 | Aqpw2 | Aqpw3 | Ainh | B | Bqpw1 | Bqpw2 | Bqpw3 | Bqpw4 | Binh |
|---|---|---|---|---|---|---|---|---|---|---|---|---|
| QPW2 | 1 | 0 | 0 | 1 | 1 | 1 | 0 | 0 | 1 | 1 | 1 | 1 |
| QPW1 | 1 | 0 | 1 | 1 | 0 | 1 | 0 | 1 | 1 | 0 | 0 | 1 |
| UP | 1 | 0 | 0 | 0 | 0 | 1 | 0 | 0 | 0 | 0 | 0 | 1 |
| LP | 1 | 1 | 1 | 1 | 1 | 1 | 0 | 0 | 0 | 0 | 1 | 1 |

Fig. 16A

| Latch: | Er | A | Aqpw1 | Aqpw2 | Aqpw3 | Ainh | B | Bqpw1 | Bqpw2 | Bqpw3 | Binh |
|---|---|---|---|---|---|---|---|---|---|---|---|
| QPW2 | 1 | 0 | 0 | 1 | 1 | 1 | 0 | 0 | 1 | 1 | 1 |
| QPW1 | 1 | 0 | 1 | 1 | 0 | 1 | 0 | 1 | 1 | 0 | 1 |
| UP | 1 | 0 | 0 | 0 | 0 | 1 | 0 | 0 | 0 | 0 | 1 |
| MP | 1 | 1 | 1 | 1 | 1 | 1 | 0 | 0 | 0 | 0 | 1 |
| LP | 1 | 1 | 1 | 1 | 1 | 1 | 1 | 1 | 1 | 1 | 1 |

Fig. 16B

| Latch: | C | Cqpw1 | Cqpw2 | Cqpw3 | Cinh | D | Dqpw1 | Dqpw2 | Dqpw3 | Dinh |
|---|---|---|---|---|---|---|---|---|---|---|
| QPW2 | 0 | 0 | 1 | 1 | 1 | 0 | 0 | 1 | 1 | 1 |
| QPW1 | 0 | 1 | 1 | 0 | 1 | 0 | 1 | 1 | 0 | 1 |
| UP | 1 | 1 | 1 | 1 | 1 | 1 | 1 | 1 | 1 | 1 |
| MP | 0 | 0 | 0 | 0 | 1 | 0 | 0 | 0 | 0 | 1 |
| LP | 1 | 1 | 1 | 1 | 1 | 0 | 0 | 0 | 0 | 1 |

Fig. 16C

| Latch: | E | Eqpw1 | Eqpw2 | Eqpw3 | Einh | F | Fqpw1 | Fqpw2 | Fqpw3 | Finh |
|---|---|---|---|---|---|---|---|---|---|---|
| QPW2 | 0 | 0 | 1 | 1 | 1 | 0 | 0 | 1 | 1 | 1 |
| QPW1 | 0 | 1 | 1 | 0 | 1 | 0 | 1 | 1 | 0 | 1 |
| UP | 0 | 0 | 0 | 0 | 1 | 0 | 0 | 0 | 0 | 1 |
| MP | 0 | 0 | 0 | 0 | 1 | 1 | 1 | 1 | 1 | 1 |
| LP | 0 | 0 | 0 | 0 | 1 | 0 | 0 | 0 | 0 | 1 |

Fig. 16D

| Latch: | G | Gqpw1 | Gqpw2 | Gqpw3 | Ginh |
|---|---|---|---|---|---|
| QPW2 | 0 | 0 | 1 | 1 | 1 |
| QPW1 | 0 | 1 | 1 | 0 | 1 |
| UP | 1 | 1 | 1 | 1 | 1 |
| MP | 1 | 1 | 1 | 1 | 1 |
| LP | 0 | 0 | 0 | 0 | 1 |

Fig. 17

| Latch: | E | A | Ainh | B | Bqpw1 | Binh | C | Cinh |
|---|---|---|---|---|---|---|---|---|
| UP | 1 | 0 | 1 | 0 | 0 | 1 | 1 | 1 |
| LP | 1 | 1 | 1 | 0 | 1 | 1 | 0 | 1 |

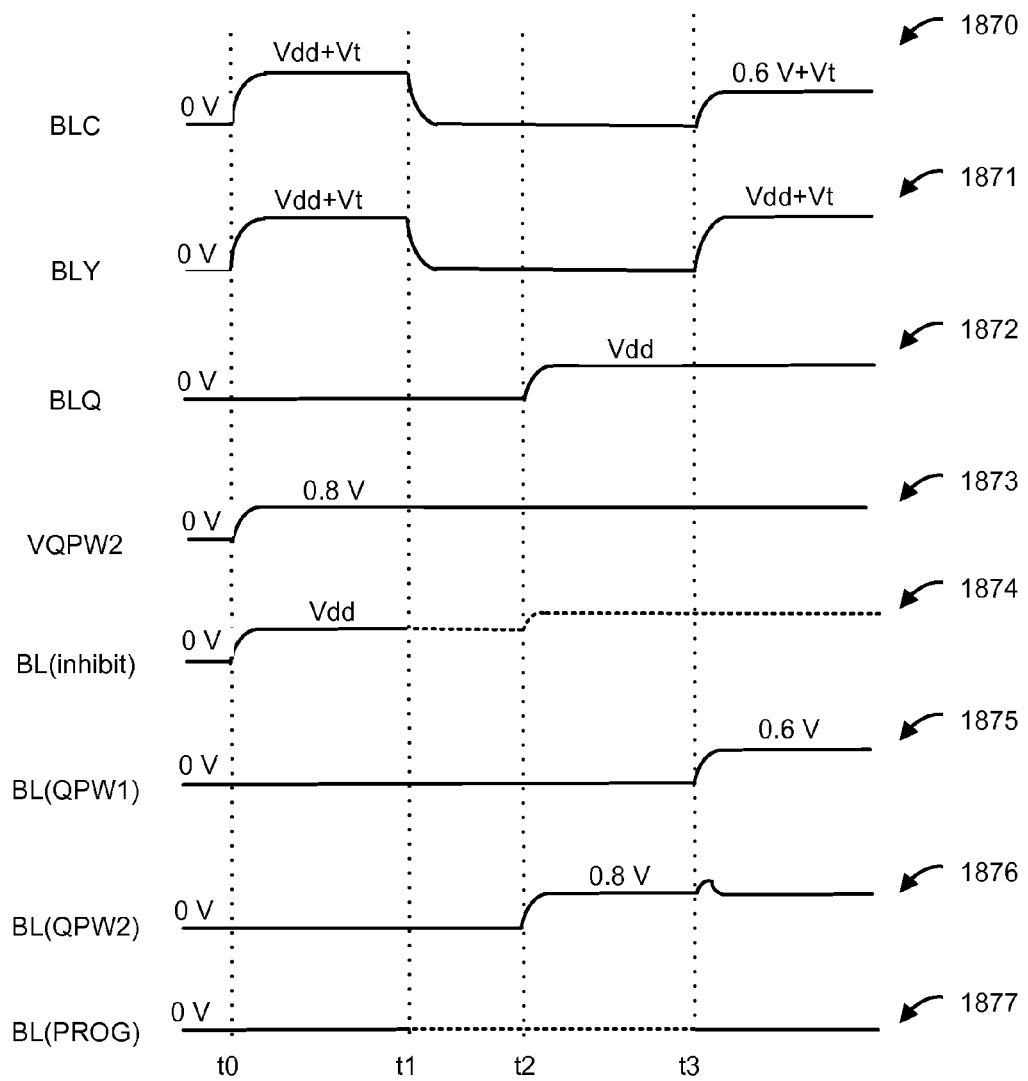

DYNAMIC BIT LINE BIAS FOR PROGRAMMING NON-VOLATILE MEMORY

CLAIM OF PRIORITY

This application is a continuation application of U.S. patent application Ser. No. 13/660,203, entitled "Dynamic Bit Line Bias For Programming Non-Volatile Memory," filed Oct. 25, 2012, published as US 2014/0119126 on May 1, 2014 and issued as U.S. Pat. No. 8,953,386 on Feb. 10, 2015, and incorporated herein by reference in its entirety.

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Techniques are need for accurately programming the threshold voltage ranges, in particular, as memory devices are scaled down.

BRIEF DESCRIPTION OF THE DRAWINGS

FIG. 8A depicts a program operation in which fast and slow programming modes are used, and a bit line voltage is used in the slow programming mode as a function of a count of program pulses in the slow programming mode.

FIG. 10A depicts bit line voltages which can be used in a slow programming mode, where a same bit line voltage $Vbl\_s1$ is used during two program pulses after which a higher bit line voltage $Vbl\_s2$ is used during a subsequent program pulse.

FIG. 10B depicts bit line voltages which can be used in a slow programming mode, where different bit line voltages $Vbl\_s2$ and $Vbl\_s3$ having increasingly smaller step sizes are used during a slow programming mode.

FIG. 13 depicts values in data latches during a program operation where a single latch is used to indicate whether the fast or slow programming mode is active.

FIG. 14A depicts values in data latches during a program operation in which a bit combination from the "A" state is re-used for the "B" state to provide a count of up to two program pulses in the slow programming mode, in combination with a single latch which is used to indicate whether the fast or slow programming mode is active.

FIG. 14B depicts values in data latches during a program operation in which a bit combination from the "A" state is re-used for the "C" state to provide a count of up to two program pulses in the slow programming mode, in combination with a single latch which is used to indicate whether the fast or slow programming mode is active.

FIG. 15A depicts values in data latches for states E, A and B during a program operation where two latches are used to provide a count of up to three program pulses in a slow programming mode.

FIG. 15B depicts a continuation of the table of FIG. 15A, showing values in data latches for state C.

FIG. 15C depicts values in data latches during a program operation in which a bit combination from the "A" state is re-used for the "B" state to provide a count of up to four program pulses in the slow programming mode, in combination with two latches which are also used to provide the count. The latch values for the C state are as depicted in FIG. 15B.

FIGS. 16A to 16D depict values in data latches for states Er and A through G during a program operation where two latches are used to provide a count of up to three program pulses in a slow programming mode.

FIG. 17 depicts values in data latches during a program operation in which a bit combination from the "A" state is re-used for the "B" state to provide a count of one program pulse in the slow programming mode.

FIG. 18B depicts voltages relating to the circuitry of FIG. 18A during the program portion of a program-verify iteration.

FIG. 18C depicts values for the FLG and SEN nodes of FIG. 18A during different phases of the program portion of FIG. 18B.

DETAILED DESCRIPTION

Figure 1:
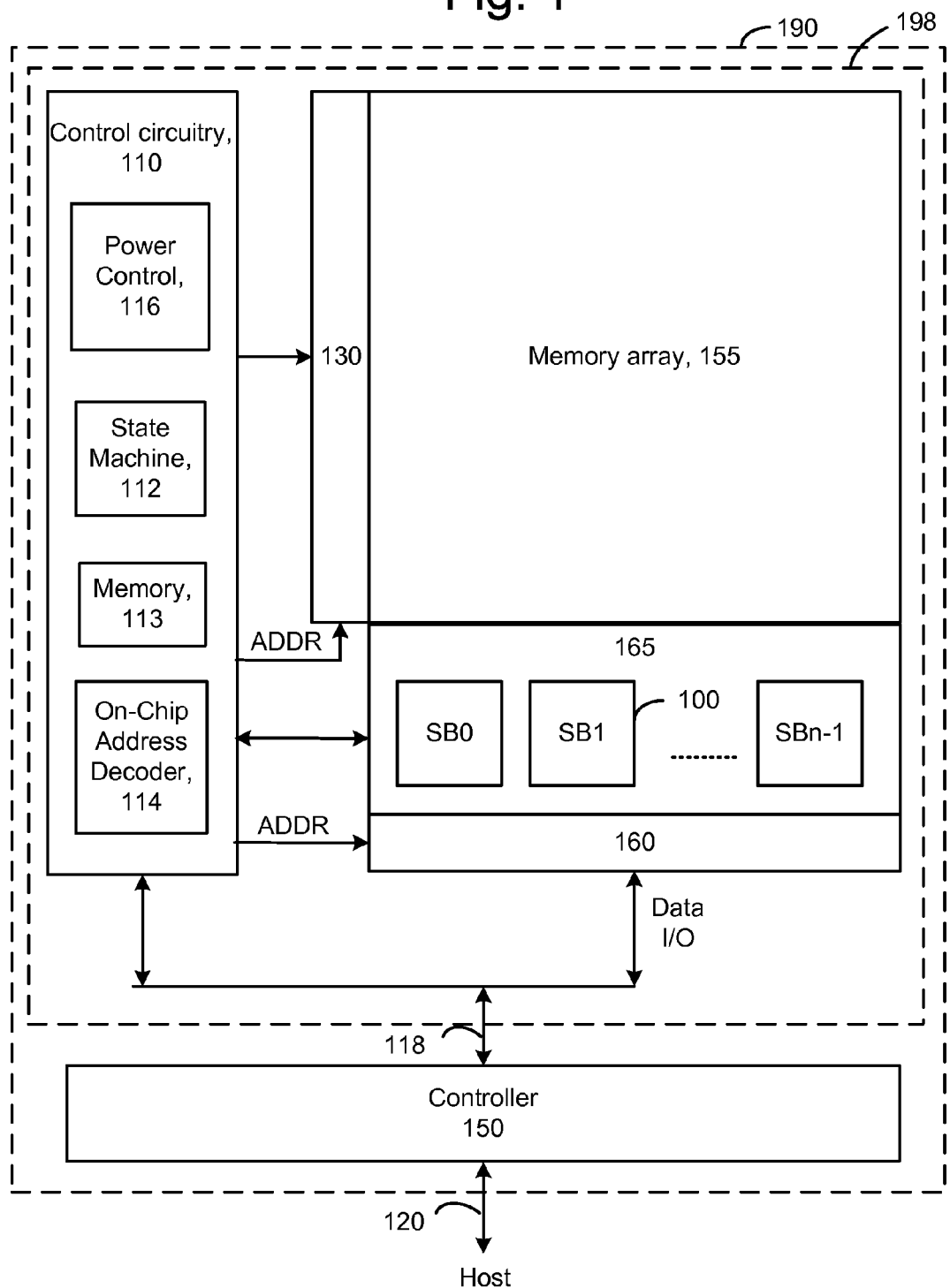
FIG. 1 is a block diagram of a non-volatile memory system using single row/column decoders and read/write circuits.

A method and non-volatile storage system are provided for accurate programming.

During program operations, there is a tradeoff between reducing programming time and achieving narrow threshold voltage (Vth) distributions for the different data states. Programming speed can be increased by using a larger program pulse step size. However, this results in large overshoots past the verify level, causing a wide Vth distribution. On the other hand, if a smaller program pulse step size is used, a narrow Vth distribution is achieved at the cost of increased programming time. Another approach is to verify the storage elements at two separate verify levels for each target data state. Before the Vth of a storage element reaches a lower verify level (VL) of its target data state, its bit line voltage (Vbl) is set to a low level such as 0 V to cause the storage element to have a relatively fast programming speed. When the Vth of the storage element exceeds the lower verify level, its Vbl is set to an intermediate level to cause the storage element to have a relatively slow programming speed. When the Vth of the storage element exceeds a higher verify level (VH) of its target data state, its Vbl is set to a high level to inhibit (lockout) programming of the storage element.

Moreover, with Vbl=0 V, the Vth of a storage element increases with each program pulse by an amount which is roughly equal to a step size of the program pulse. With the intermediate Vbl, the Vth of a storage element increases with each program pulse by an amount which is less than the step size of the program pulse. The distance between the lower and higher verify levels for each state can be optimized on silicon and set to the point at which the Vth distributions are narrowest.

However, if the gap between the lower and higher verify levels is too high, the Vth increases of the storage element will transition back to a steady state value (e.g., the same as the program pulse step size) and hence the slow programming speed is not realized. On the other hand, if the gap between the lower and higher verify levels is too small, the Vth of many storage elements can jump over the gap in one program pulse and hence their programming speed is not slowed down. In general, the optimum gap is a function of the program pulse step size. A larger program pulse step size tends to increase the optimum gap because the Vth takes larger jumps with each program pulse and hence a larger gap is required to ensure that the Vth does not jump over the gap and past the higher verify level with only one program pulse.

Moreover, as memory devices are scaled down, program noise becomes worse; where program noise is defined as the deviation in program speed for a storage element from the nominal Vth jump (e.g., the same as the program pulse step size). At a certain program pulse, even though the Vth of a majority of the storage elements jumps by an amount which is roughly equal to the program pulse step size, there are many storage elements for which the Vth jump is much higher. As a result, the optimum gap differs for different storage elements and is difficult to optimize for a set of storage elements.

To overcome these problems, a programming technique is provided which ensures that each storage element experiences a uniformly slow programming speed when its Vth is between the lower and higher verify levels of its target data state. A count can be maintained of the program pulses which are applied to a storage element in a slow programming mode, and the Vbl for the storage element is adjusted to one or more intermediate levels based on the count. Each of the intermediate levels slows the programming without inhibiting (stopping) programming. In one approach, Vbl steps up with each successive program pulse which is counted. Other approaches are possible as well. The Vbl can be set independently for each storage element based on a programming progress of the storage element. Thus, the programming is optimized for each storage element. As a result, a tighter Vth distribution is obtained for a set of storage elements.

Variations to the programming technique include using a fixed Vbl step based on the count, a varying Vbl step based on the count, a data state-dependent Vbl step based on the count, and an option to not step up Vbl for one or more program pulses which are counted.

Data latches associated with each bit line can be used to maintain the count of program pulses. In one approach, the data latches associated with each bit line maintain two or more bits of data which allow counting of up to three program pulses after the Vth of a storage element first exceeds the lower verify level.

An example memory system which can be used is discussed next. Generally, any type of non-volatile memory can be used. A memory with NAND strings is an example only. FIG. 1 is a block diagram of a non-volatile memory system using single row/column decoders and read/write circuits. The diagram illustrates a memory device 190 having read/write circuits for reading and programming a page of storage elements in parallel, according to one embodiment. Memory device 190 may include one or more memory die 198. Memory die 198 includes a two-dimensional memory array 155 of storage elements, control circuitry 110, and read/write circuits 165.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine as discussed further below.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control module 116, sense blocks 100 (including the processor 192 and managing circuit MC0 in FIG. 3A), read/write circuits 165, and controller 150, and so forth. The sense block 100 is discussed further in connection with FIG. 3A.

In another embodiment, a non-volatile memory system uses dual row/column decoders and read/write circuits. The various peripheral circuits access opposite sides of the memory array 155 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2A:
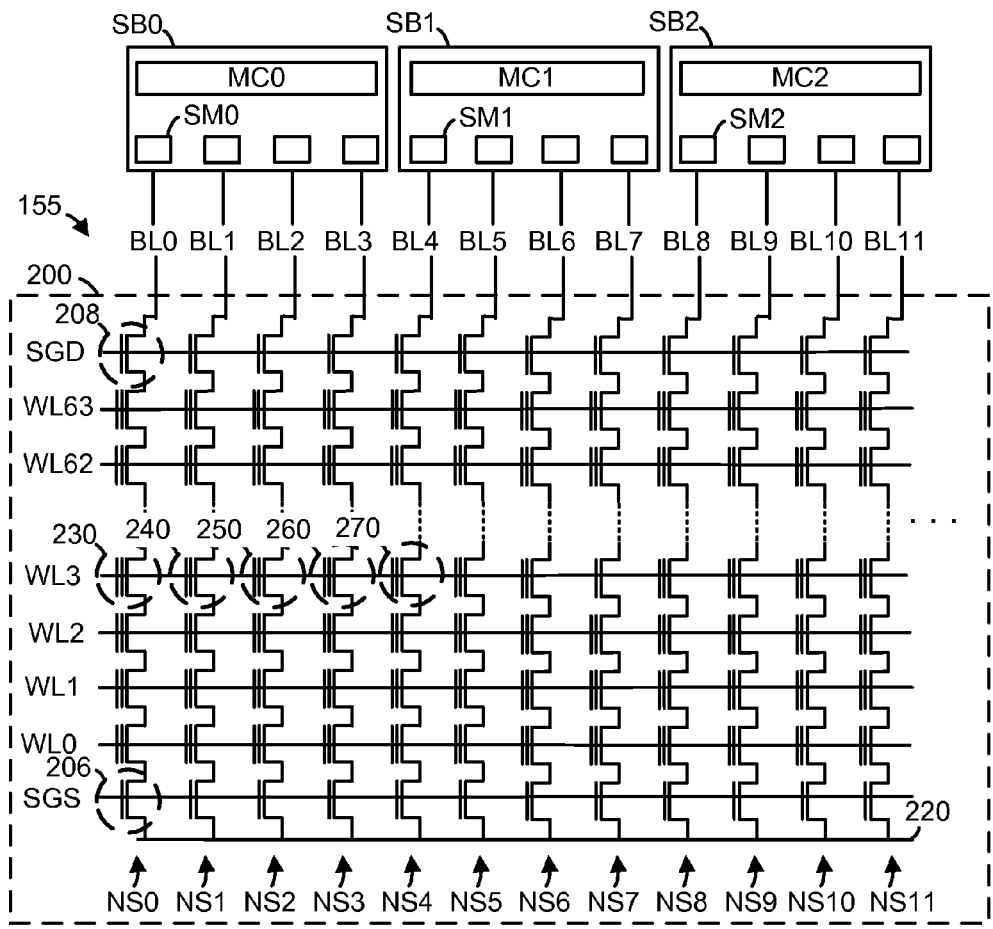
FIG. 2A depicts a block of NAND flash memory cells in the memory array 155 of FIG. 1 and associated sense blocks SB0, SB1 and SB2.

FIG. 2A depicts a block of NAND flash memory cells in the memory array 155 of FIG. 1 and associated sense blocks SB0, SB1 and SB2. The memory array can include many blocks. An example block 200 includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate which, in turn, is connected to a common source line 220. For example, NS0 includes a source side select gate transistor 206 and a drain side select gate transistor 208. Example storage elements 230, 240, 250, 260 and 270 are in NS0 to NS4, respectively, and are connected to WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 3A.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
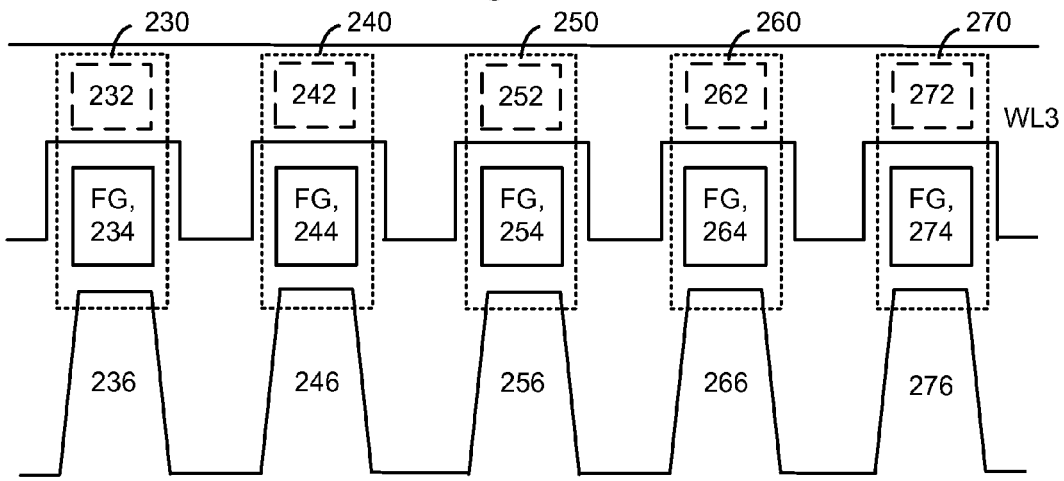
FIG. 2B depicts a cross-sectional view of the NAND strings of FIG. 2A.

FIG. 2B depicts a cross-sectional view of the NAND strings of FIG. 2A. A bit line or NAND string direction goes into the page, and a word line direction goes from left to right. As an example, WL3 extends across NAND strings NS0 to NS4 which include respective channel regions 236, 246, 256, 266 and 276. The storage element 230 in NS0 includes a control gate 232, a floating gate 234 and the channel region 236. The storage element 240 in NS1 includes a control gate 242, a floating gate 244 and the channel region 246. The storage element 250 in NS2 includes a control gate 252, a floating gate 254 and the channel region 256. The storage element 260 in NS3 includes a control gate 262, a floating gate 264 and the channel region 266. The storage element 270 in NS4 includes a control gate 272, a floating gate 274 and the channel region 276.

Figure 3A:
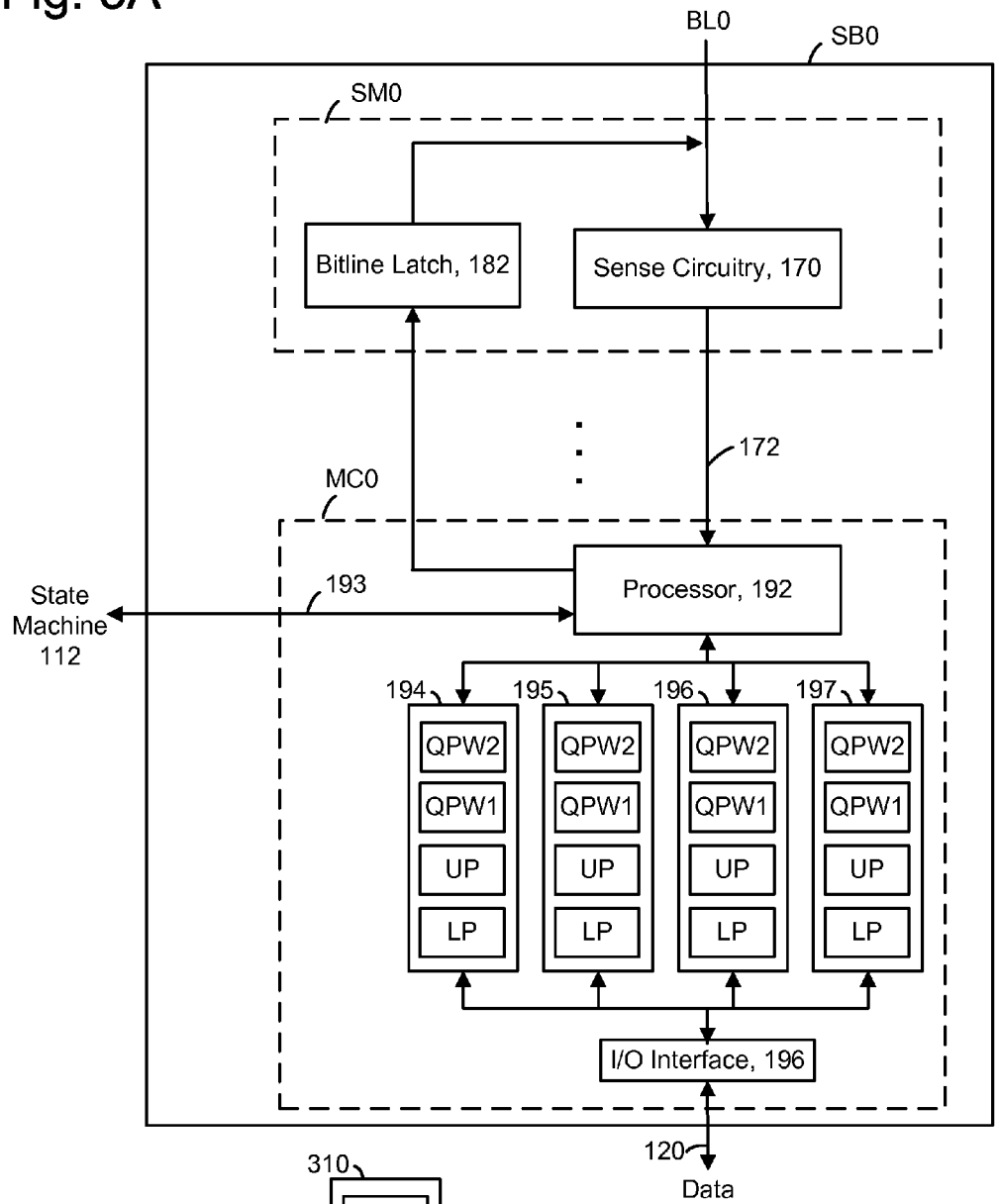
FIG. 3A is a block diagram depicting one embodiment of the sense block SB0 of FIG. 1.

FIG. 3A is a block diagram depicting one embodiment of the sense block SB0 of FIG. 1. The individual sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of storage elements.

The sense module SM0 comprises sense circuitry 170 that performs sensing by determining whether a conduction current in a connected bit line is above or below a predetermined threshold level. SM0 includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, flag=0 can inhibit programming, while flag=1 allows programming. Further details of an example sense module are provided in FIGS. 18A to 18C.

Managing circuit MC0 comprises a processor 192, four example sets of data latches 194-197 and an I/O Interface 196 coupled between the set of data latches 194 and data bus 120. One set of data latches can be provide for each sense module, and data latches identified by LP, UP, QPW1 and QPW2 may be provided for each set. In some cases, additional data latches may be used. In other cases, fewer data latches may be used. LP stores a bit for a lower page of data, and UP stores a bit for an upper page of data. This is in a four-level or two-bits per storage element memory device. In each set of latches, one or more additional data latches, each storing one bit of data, can be provided to maintain a count of program pulses which are applied to the storage element when its Vth is between the lower and higher verify levels, e.g., when the storage element experiences slow programming. In this example, two additional data latches QPW1 and QPW2 are depicted.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed storage element. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves double duty, both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP latches, in a two-bit per storage element implementation. In a three-bit per storage element implementation, one extra data latch MP may be used, to store the middle page data. The program operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two states agree, the processor 192 sets the bit line latch 182 to cause the bit line to be pulled to a state designating program inhibit. This inhibits the storage element coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 6A:
FIGS. 6A to 6D depict a three pass program operation with fast and slow programming modes used on the third pass.
Figure 6B:
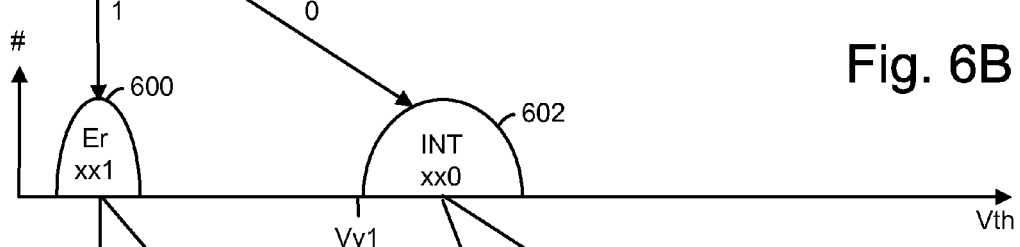
Figure 6C:
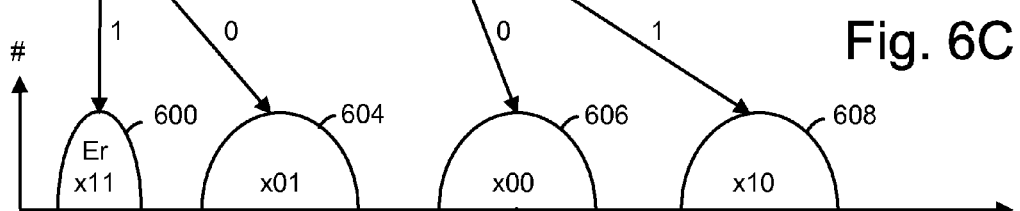

The data latches identify when an associated storage element has reached certain mileposts in a program operation. For example, latches may identify that the Vth of a storage element is below a particular verify level. The data latches indicate whether a storage element currently stores one or more bits from a page of data. For example, the LP latches can be used to store a lower page of data. An LP latch is flipped (e.g., from 0 to 1) when a lower page bit is stored in an associated storage element. The UP latches can be used to store an upper page of data, for instance. An UP latch is flipped when an upper page bit is stored in an associated storage element. The flipping of a bit occurs when an associated storage element completes programming, e.g., when its Vth exceeds a target verify level such as VvaH, VvbH or VvcH. When lower, middle and upper page bits are used (e.g., in case of three-bit per storage element memory), they are stored in latches referred to as LP, MP and UP, respectively. MP is flipped when a middle page bit is stored in an associated storage element, and UP is flipped when an upper page bit is stored in an associated storage element. For example, in FIG. 6B to 6D, the first bit (from right to left) is the lower page bit, the second bit is the middle page bit and the third bit is the upper page bit. Additional information regarding the setting of latches is provided, e.g., in connection with FIGS. 13 to 17. The use of a set of four data latches in particular is discussed also in connection with FIGS. 15A-C.

Figure 3C:
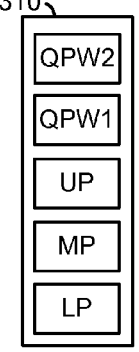
FIG. 3C is a block diagram depicting a set of five data latches as an alternative to the set of four data latches depicted in FIG. 3A.
Figure 3B:
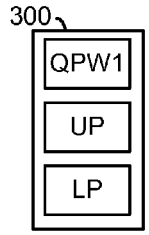
FIG. 3B is a block diagram depicting a set of three data latches as an alternative to the set of four data latches depicted in FIG. 3A.

FIG. 3B is a block diagram depicting a set of three data latches as an alternative to the set of four data latches depicted in FIG. 3A. The set 300 includes latches LP, UP and QPW1. This arrangement is discussed also in connection with FIGS. 8B, 14A and 14B.

FIG. 3C is a block diagram depicting a set of five data latches as an alternative to the set of four data latches depicted in FIG. 3A. The set 310 includes latches LP, MP, UP, QPW1 and QPW2. This arrangement is discussed also in connection with FIGS. 16A to 16D.

Figure 3D:
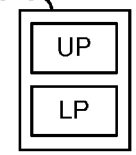
FIG. 3D is a block diagram depicting a set of two data latches as an alternative to the sets of four data latches depicted in FIG. 3A.

FIG. 3D is a block diagram depicting a set of two data latches as an alternative to the sets of four data latches depicted in FIG. 3A. The set 320 includes latches LP and UP. This arrangement is discussed also in connection with FIG. 17.

Figure 4A:
FIGS. 4A and 4B depict a one pass program operation with fast and slow programming modes.
Figure 4B:
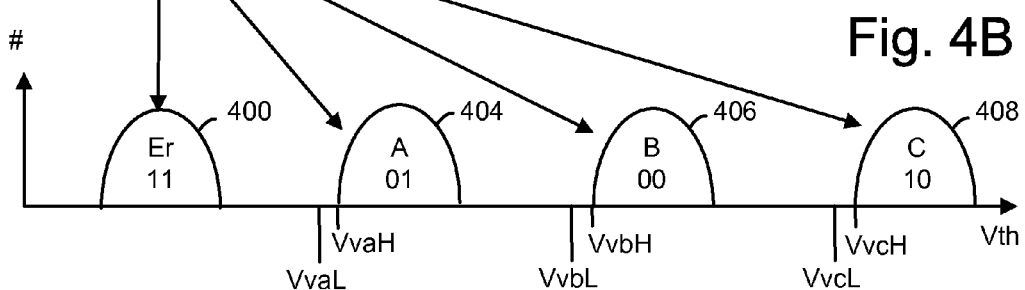

FIGS. 4A and 4B depict a one pass program operation with fast and slow programming modes. One pass programming is also referred to as "one-pass write" programming. A programming pass is generally meant to encompass a sequence of multiple program-verify operations which are performed starting from an initial Vpg level and proceeding to a final Vpg level until the threshold voltages of a set of selected storage elements reach one or more respective verify levels of respective target data states. In one pass programming, all storage elements are initially in an erased state. Some of the storage elements are not programmed and remain in the erased state while others are programmed to higher target data states.

Example Vth distributions for the storage element array are provided for a case where each storage element stores two bits of data. Each graph depicts Vth on the horizontal axis and a number or population of storage elements in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 400 is provided for erased (Er) state storage elements. Three Vth distributions 404, 406 and 408 represent target data states A, B and C, respectively, which are reached by storage elements when their Vth exceeds a higher verify level VvaH, VvbH or VvcH, respectively. In this case, each storage element can store two bits of data in one of four possible Vth ranges, referred to as states Er, A, B and C. A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. QPW mode and slow programming mode are used interchangeably herein.

When QPW is used, lower verify levels (VvaL, VvbL or VvcL) are defined such that the storage elements enter a slow down programming mode or zone (e.g., by raising the associated bit line voltages applied during program) when their Vth is between the lower verify level and the higher verify level of a respective target data state. The lower verify levels are offset below the respective higher verify levels, in one implementation. Specifically, when a verify test determines that the Vth of a storage element exceeds the lower verify level associated with the target data state of the storage element, a slow programming mode begins for the storage element. Subsequently, when a verify test determines that the Vth of a storage element exceeds the higher verify level associated with the target data state of the storage element, the storage element is locked out from further programming.

In some cases, QPW is used on fewer than all target data states. For example, a wider Vth distribution may be acceptable for the highest data state (e.g., the C state in this example). Total programming time may be reduced by avoiding the use of QPW with the highest data state, since the time spent in sensing whether the Vth exceeds VvcL can be avoided. Generally, QPW can be used for selected target data states based on testing which identifies the target data states for which QPW yields the most benefit.

The specific relationship between the data programmed into a storage element and the Vth level of the storage element depends upon the data encoding scheme adopted for the storage elements. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the E, A, B and C state. Read reference voltages which are between the distributions are used for reading data from the storage elements. By testing whether the Vth of a given storage element is above or below one or more of the read reference voltages, the system can determine the data state which is represented by a storage element.

Figure 5A:
FIGS. 5A to 5C depict a two pass program operation with fast and slow programming modes used on the second pass.
Figure 5B:
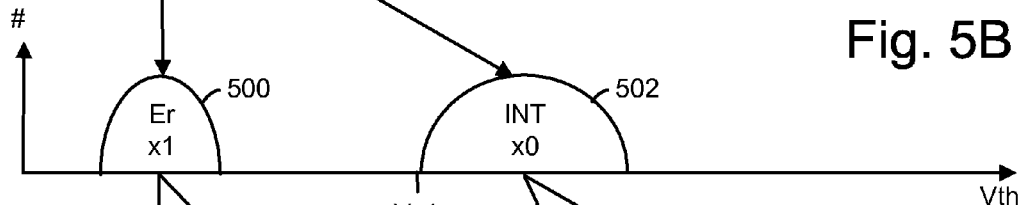
Figure 5C:
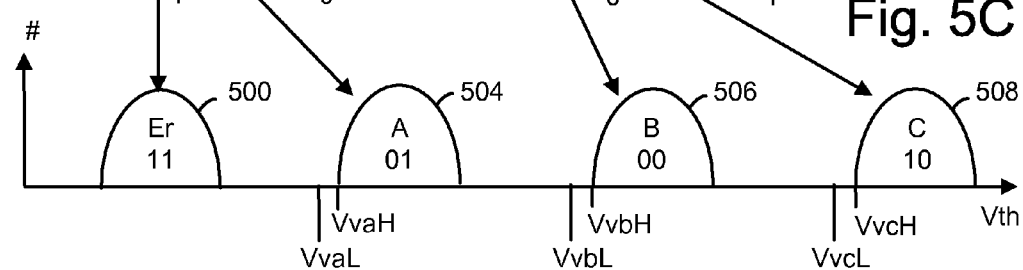

FIGS. 5A to 5C depict a two pass program operation with fast and slow programming modes used on the second pass, and only fast programming mode used on the first pass. Each pass can be used to program a page of data. For example, programming of lower and upper pages in two-bit, four-level storage elements is provided. Programming can be performed one logical page at a time, with the lower page followed by the upper page. Initially, all storage elements are in the Er state, represented by the distribution 500 in FIG. 5A.

FIG. 5B depicts programming of a lower page of data. If the lower page has a bit=1, the associated storage element remains in the distribution 500 and the data is represented by x1, where x is an upper page bit that is not yet known. If the lower page has a bit=0, the storage element is programmed to a higher Vth as represented by distribution 502, which is an interim distribution (INT), using a verify level Vv1. The data of these storage elements is represented by x0. Note that the interim distribution can be relatively wide since it is not a final distribution and does not represent a final data state.

FIG. 5C depicts programming of an upper page of data. If UP/LP=11, the associated storage element in the distribution 500 remains in the distribution 500 and stores data bits 11. If UP/LP=01, the storage elements in the distribution 500 are programmed to the distribution 504 (state A) and a slow down programming mode is used when the Vth is between VvaL VvaH. If UP/LP=10, the storage elements in the distribution 502 are programmed to the distribution 508 (state C) and a slow down programming mode is used when the Vth is between VvcL and VvcH. If UP/LP=00, the storage elements in the distribution 502 are programmed to the distribution 506 (state B) and a slow down programming mode is used when the Vth is between VvbL and VvbH.

Programming can be similarly extended to three or more bits per storage element. For example, FIGS. 6A to 6D depict a three pass program operation with fast and slow programming modes used on the third pass. Programming of lower, middle and upper pages in three-bit, eight-level storage elements is depicted. Seven programmed data states A through G are used in addition to Er for eight states total. Initially, all storage elements are in the Er state, represented by the distribution 600. The lower page is programmed in FIG. 6B. If LP=1, storage elements in distribution 600 remain in that distribution. If LP=0, storage elements in distribution 600 are programmed to an interim distribution 602 using Vv1. The middle page is programmed in FIG. 6C. If MP=1, storage elements in distribution 600 remain in that distribution, and storage elements in distribution 602 are programmed to interim distribution 608 using verify level Vv4. If MP=0, storage elements in distribution 600 are programmed to interim distribution 604 using verify level Vv2, and storage elements in distribution 602 are programmed to interim distribution 606 using verify level Vv3.

Figure 6D:
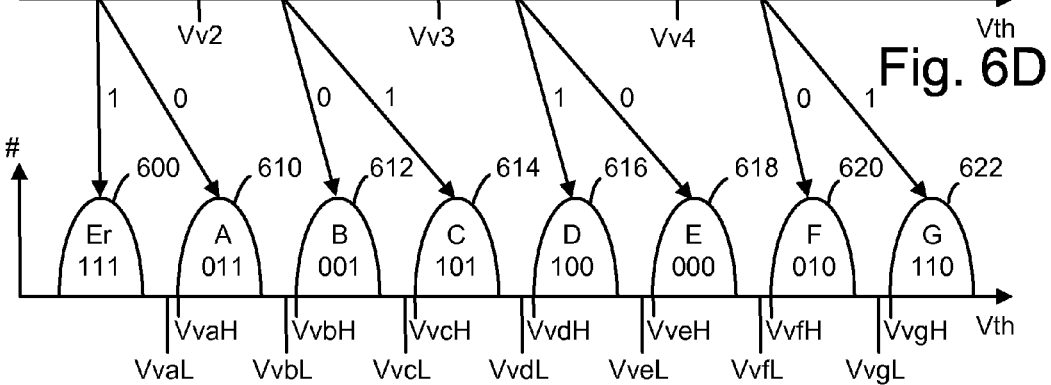

The upper page is programmed in FIG. 6D. QPW is used for this pass. If UP=1, storage elements in distribution 600 remain in that distribution, storage elements in distribution 604 are programmed to distribution 614 (state C), storage elements in distribution 606 are programmed to distribution 616 (state D), and storage elements in distribution 608 are programmed to distribution 622 (state G). If UP=0, storage elements in distribution 600 are programmed to distribution 610 (state A), storage elements in distribution 604 are programmed to distribution 612 (state B), storage elements in distribution 606 are programmed to distribution 618 (state E), and storage elements in distribution 608 are programmed to distribution 620 (state F).

Programming using four bits per cell (16 levels) can similarly involve four pages. Additionally, when programming multiple pages of data, a back and forth word line order may be used to reduce potential disturbs from capacitive coupling.

Figure 7A:
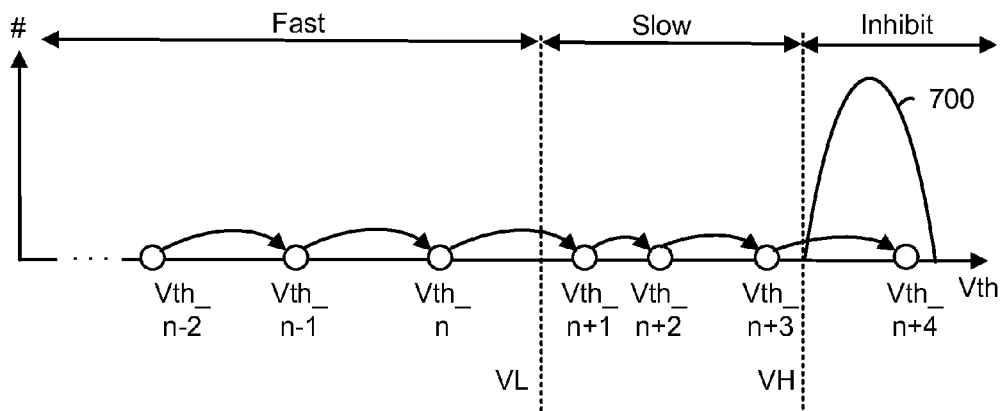
FIG. 7A depicts a progress of a Vth of a storage element in a program operation where fast and slow programming modes are used, as a result of the program voltage depicted in FIG. 7B and the bit line voltage depicted in 7C, where a single bit line voltage is used during the slow programming mode.
Figure 7B:
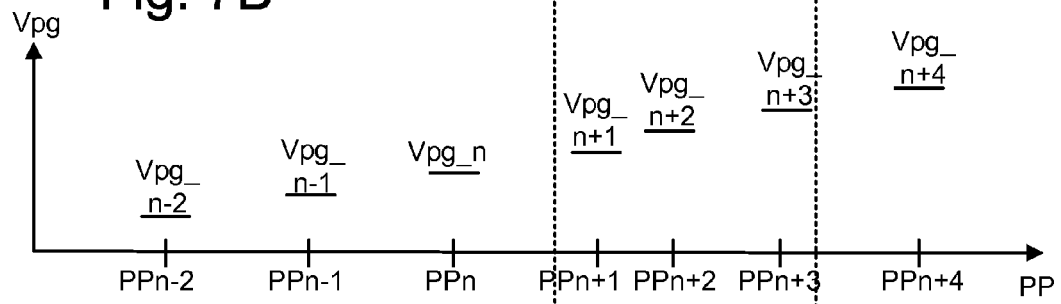
Figure 7C:
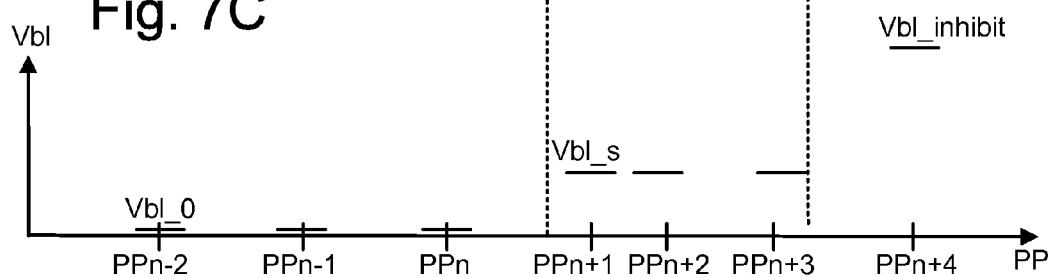

FIG. 7A depicts a progress of a Vth of a storage element in a program operation where fast and slow programming modes are used, as a result of the program voltage depicted in FIG. 7B and the bit line voltage depicted in 7C, where a single Vbl is used during the slow programming mode. The horizontal axis depicts Vth and the vertical axis depicts a number of cells in the Vth distribution 700. The circles depict the Vth of a storage element when a corresponding program pulse and bit line voltage are applied. A fast programming zone (Fast), slow programming zone (Slow) and inhibit zone (Inhibit) are depicted. In FIG. 7B, the horizontal axis depicts a program pulse number and the vertical axis depicts a corresponding program voltage Vpg. In FIG. 7C, the horizontal axis depicts the program pulse number and the vertical axis depicts a corresponding bit line voltage Vbl.

The fast programming mode is represented by program pulses PPn−2 through PPn, when program voltages Vpg_n−2 through Vpg_n and bit line voltage Vbl_0 (e.g., 0 V) are applied. PPn is the programming pulse which causes the Vth to increase above VL (e.g., from Vth_n to Vth_n+1). Generally, one or more initial program pulses (e.g., PPn−2 to PPn) are applied in the fast programming mode, and one or more additional program pulses (e.g., PPn+1 to PPn+3) are applied in the slow programming mode. Further program pulses such as PPn+4 are applied in the inhibit zone.

In the slow programming mode, program voltages Vpg_n+1 through Vpg_n+3 and bit line voltage Vbl_s (e.g., 0.6 V) are applied, causing the Vth to increase to Vth_n+2 through Vth_n+4, respectively. In the inhibit mode, a program pulse PPn+4 is applied using program voltage Vpg_n+4 and bit line voltage Vbl_inhibit (e.g., 2.5 V), causing no change in the Vth. PPn+3 is the programming pulse which causes the Vth to increase above VH (e.g., from Vth_n+3 to Vth_n+4). Vbl_s is the single bit line voltage which is used during the slow programming mode.

As discussed, the slow programming mode helps to tighten the programmed Vth distributions. In one approach, the slow programming mode can be used for all states except the highest programmed state. For example, it can be used for the A/B states but not the C state when there are four data states, and for the A/B/C/D/E/F-states but not the G state when there are eight data states. Under the slow programming mode, verify tests are performed at Verify_Low (VL) and Verify_High (VH) during programming. VH is the higher or final verify level for a respective data state. Based on the Vth level of a storage element with respect to VL and VH, the bit line associated with the storage element can be biased at different levels to modulate the program speed of the storage element. If Vth<VL, the associated Vbl is set to 0 V, for instance, leading to a normal (fast) program speed. The Vth increases by roughly equal increments in the fast programming mode as represented by Vth_n−1−Vth_n−2, Vth_n−Vth_n−1 and Vth_n+1−Vth_n. Once the Vth of the storage element reaches in between VL and VH (VL<Vth<VH), the associated Vbl is raised to a slow programming level such as 0.6 V to slow down the programming. The storage element takes much smaller Vth jumps in the slow programming mode. The Vth increases by increments as represented by Vth_n+2−Vth_n+1, Vth_n+3−Vth_n+2 and Vth_n+4−Vth_n+3 in the slow programming mode. When Vth>VH for the storage element, it is locked out by setting Vbl to a power supply voltage Vdd (~2.5 V). This high Vbl inhibits the storage element from further programming during subsequent program pulses which are applied to the selected word line.

The process depicted occurs separately for each of the selected storage elements. For example, the number of program pulses (PPn) required to reach the slow programming mode can be different for different storage elements.

An optimum exists for the gap between VL and VH at which the programmed Vth distributions are tightest. To understand why, consider that if the VL to VH gap is too small, the Vth of most storage elements jumps over the gap and hence the slow programming mode is bypassed. On the other hand, if the gap is too large, then multiple program pulses are needed to cause the Vth of the storage element to increase from VL to VH. Since the Vbl applied under the slow programming mode is fixed while Vpg is stepped up at the same pace by a step size ($\Delta$Vpg such as 0.4 V), the Vth jumps of a storage element under the slow programming mode gradually increase, approaching the steady state Vth jumps ($\Delta$Vt=$\Delta$Vpg) as described also by line 1200 in FIG. 12A. For example the jump from Vth_n+1 to Vth_n+2 may be smallest, while the jump from Vth_n+2 to Vth_n+3 is larger and the jump from Vth_n+3 to Vth_n+4 may be largest, similar to the steady state Vth jumps in the fast programming mode (e.g., jumps from Vth_n−2 to Vth_n−1, Vth_n−1 to Vth_n and Vth_n to Vth_n+1).

As a result, a storage element for which the Vth reaches VH after one program pulse within the slow programming mode will advantageously arrive in the inhibit zone with a smaller $\Delta$Vth as compared to a storage element that spent more than one program pulse within the slow programming mode. Note that the width of the final Vth distribution 700 is affected by the last Vth jump that the storage element takes in the slow programming mode, just before crossing the VH level. As the VL to VH gap increases, the probability that a storage element receives more than one program pulse in the slow programming mode increases, and hence the benefit of the slow programming mode is reduced.

The number of program pulses which a storage element receives in the slow programming mode can vary. For example, due to a natural variation in the program speed from storage element to storage element, different storage elements arrive in the slow programming mode at different Vth levels. Some storage elements may enter the slow programming mode with a Vth just above VL, while other storage elements may enter the slow programming mode with a Vth just below VH. Thus, the increase in Vth which is required for different storage elements in the slow programming mode to reach the inhibit zone can vary, which in turn means a different number of program pulses are applied to different storage elements in the slow programming mode. Moreover, even if different storage elements enter the slow programming mode at the same Vth, the size of the Vth jumps for the different storage elements in the slow programming mode can vary due to program noise. Program noise causes storage elements to deviate away from uniform Vth jumps due to quantum mechanical fluctuations. As a result, there is a measurable spread in $\Delta$Vth over a population of storage elements at a given program pulse.

As memory devices are scaled down, the problem of variations in program speed among different storage elements is expected to become worse. Thus, the problem of a variation in the number of program pulses applied to different storage elements in the slow programming mode is expected to become worse, reducing the effectiveness of the slow programming mode. A proposal described next uses a dynamic bit line bias for storage elements in the slow programming mode.

FIG. 8A depicts a program operation in which fast and slow programming modes are used, and different bit line voltages are used in the slow programming mode as a function of a count of program pulses in the slow programming mode. In an example approach, during a first program pulse under the slow programming mode, Vbl will be at a relatively low level (e.g., 0.4 V) and will gradually be raised to relatively higher levels for subsequent program pulses that the storage element experiences while still in the slow programming mode. By tracking the number of program pulses applied to each storage element in the slow programming mode, and setting Vbl accordingly, the slow programming mode can be made more effective and relatively independent of the number of program pulses applied to each storage element in the slow programming mode. Overall, the effectiveness of the slow programming mode is improved, resulting in tighter Vth distributions.

A program operation begins at step 800. Step 801 sets data in latches associated with each storage element to be programmed based on a respective target data state of the storage element. For example, this can be data in the LP and UP latches of FIG. 3A, or in the LP, MP and UP latches of FIG. 3C. The data can be loaded in to the latches by the state machine 112, for instance. A program-verify iteration begins at step 802. Step 803 involves reading the latches to determine a Vbl to set for each storage element. In one option, at step 804, data in the latches indicates that fast programming is to be performed so that Vbl is set to Vbl_0 (e.g., 0 V), an initial level which allows programming. In another option, at step 805, data in the latches indicates that slow programming is to be performed so that Vbl is set to one or more stepped up levels (Vbl_s) as a function of a count of program pulses in the slow programming mode. The one or more stepped up levels allow programming. In another option, at step 806, data in the latches indicates that programming is to be inhibited so that Vbl is set to a level (Vbl_inhibit) which inhibits programming.

At step 807, a program pulse is applied to a selected word line with Vbl at the configured level for each selected storage element along the selected word line. At step 808, a verify test is performed for each selected storage element, e.g., using lower and higher verify levels associated with the different target data states. In one possible approach, the sensing to determine whether the Vth of a memory cell exceeds the lower verify voltage of its target data state can involve applying the lower verify voltage to the control gate of the memory cell via a word line and determining, after a specified sense time, whether a current through the memory cell and associated NAND string is greater than a reference current. The sense time and reference current can be the same when determining whether the Vth of a memory cell exceeds the higher verify voltage of its target data state. In this case, the higher verify voltage is applied to the control gate of the memory cell via the word line.

In another approach, the same control gate voltage is used to determine whether the Vth of a memory cell exceeds the lower or higher verify voltage. In this case, a sensing parameter such as sense time and/or reference current can be adjusted. For example, the higher verify voltage can be applied to the control gate of a memory cell to determine whether the Vth exceeds the lower verify voltage by using a shorter sense time and/or a lower reference current. In this example, the higher verify voltage can also be applied to the control gate of the memory cell to determine whether the Vth exceeds the higher verify voltage by using a longer sense time and/or a higher reference current. This approach avoids having to generate an additional control gate voltage for sensing the lower verify voltages.

One of three paths is followed for each storage element. In one path, at step 809, for a storage element with a Vth below the lower verify level of its target data state (fast programming mode), the data in the respective latches associated with the storage element is not changed. In a second path, at step 810, for a storage element with a Vth between the lower and higher verify levels of its target data state (slow programming mode), the data in the respective latches associated with the storage element is updated to increment a count. For example, a count may be initialized to zero and incremented to one when step 810 is performed the first time for a storage element. This indicates that the next program pulse will be the first program pulse that is applied to the storage element while in the slow programming mode. In a third path, at step 811, for a storage element with a Vth above the higher verify level of its target data state (inhibit mode), the data in the respective latches associated with the storage element is updated to inhibit programming during the next program pulse. The latches are updated to inhibit programming in the first pass through step 811 and maintained to inhibit programming in subsequent passes through step 811. Note that, once a storage element is inhibited, it is no longer sensed during subsequent program verify tests, since it has already been judged to be at its target Vth level.

Step 812 optionally re-uses a bit combination which is no longer used, to provide one or more additional values for a count of programming pulses in the slow programming mode. See FIGS. 8B, 14A, 14B, 15C and 17 for further details. The bit combination is re-used from latches associated with a set of storage elements having one target data state which have completed programming, to latches associated with storage elements having another target data state which have not yet completed programming. At decision step 813, if there is a next program-verify iteration, the next program-verify iteration begins at step 802. Otherwise, the program operation ends at step 814.

Figure 8B:
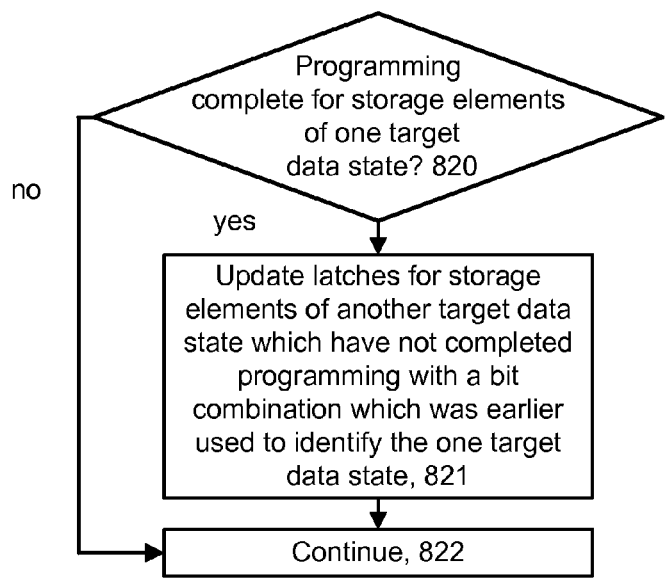
FIG. 8B provides example details regarding step 812 of FIG. 8A in which a bit combination is re-used in data latches to provide an additional count of program pulses in the slow programming mode.

FIG. 8B provides example details regarding step 812 of FIG. 8A in which a bit combination is re-used in data latches to provide an additional count of program pulses in the slow programming mode. Decision step 820 determines if programming is complete for storage elements of one target data state. This is a predetermined target data state which typically finishes programming sooner than other target data states. For example, in the program operation of FIGS. 4A and 4B, the A state would normally finish programming before the B and C states, and the B state would normally finish programming before the C state. See FIG. 8C, for instance, which indicates that the A state storage elements complete programming after the eight program-verify iterations so that the bit combination re-use can begin with the ninth program-verify iteration.

For the A state, for instance, the completion of programming can occur when the Vth of all, or a specified portion of the storage element whose target state is the A state, has been verified to exceed VvaH, the higher verify level for state A. A bit ignore criteria can be used so that programming is considered to be completed even if a small number (e.g., 1-10%) of the A state storage element have not passed the verify test using VvaH. If programming is not complete for the one target data state, a continue step 822 is reached. Step 813 in FIG. 8A is then reached. If programming is complete for the one target data state, step 821 updates latches for storage elements of another target data state (e.g., the B or C state) which have not completed programming with a bit combination which was earlier used to identify the one target data state, before the programming is complete for the one target data state.

For example, in FIG. 14A, the bit combination of 10 (LP=1 and UP=0) identifies the A state. This bit combination is re-used to identify a Bqpw2 state for the B state storage elements, once the A state storage elements have finished programming completely or at least, they have finished the fast programming portion. This provides a count of a second program pulse in the slow programming mode, whereas a count of only one program pulse in the slow programming mode would be available without the re-use of the bit combination. As another example, in FIG. 14B, the bit combination of 10 is re-used to identify a Cqpw2 state for the C state storage elements. As another example, in FIG. 15C, the bit combination of 10 is re-used to identify a Bqpw4 state for the B state storage elements. This provides a count of a fourth program pulse in the slow programming mode, whereas a count of only three program pulses in the slow programming mode would be available without the re-use of the bit combination.

By providing an additional count value in the slow programming mode, additional flexibility is obtained in setting Vbl as a function of the count, so that a narrow Vth distribution can be achieved. For example, the additional count value can be used to set an additional Vbl level which allows the Vth to be more precisely controlled. Or, the additional count value can be used to provide a different function of Vbl versus count which allows the Vth to be more precisely controlled. For instance, a new Vbl can be set when the count is four program pulses instead of three program pulses.

Note that when programming is complete for the A state, some portion of the B state storage elements may have already completed programming. As a result, the additional count value for the slow programming mode will be used only by the remaining B state storage elements for which the Vth has not yet reached the respective verify level of VvbH. However, benefits are still obtained since the Vth can be more precisely controlled for these remaining B state storage elements. Similar reasoning applies when the additional count value is provided for the C state storage elements. In practice, when programming is complete for the A state storage elements, fewer C state storage elements than B state storage elements will have completed programming, so that relatively more C state storage elements will benefit from the additional count value.

Many variations are possible with the re-use of bit combinations. For example, bit combinations from multiple target data states may be re-used when programming is completed for those multiple target data states. For example, a bit combination from the A state can be used for the B state when the A state completes programming, as mentioned. Further, a bit combination from the B state can be used for the C state when the B state completes programming. It is also possible for the bit combination from the A state to be used for the C state when the A state completes programming, and for the bit combination from the B state to be used for the C state when the B state completes programming. This would allow two additional count values for the C state.

In another approach, a bit combination can be re-used by storage elements of multiple target data states in a sequence. For instance, the bit combination from state A can be re-used for state B until a criterion is met, after which the bit combination from state A is re-used for state C and is no longer re-used by state B. In one approach, the criterion is a function of the programming progress of the B state storage elements. For example, the bit combination may be re-used for the B state until some portion of the B state storage elements has completed programming, or until a Vth of some portion of the B state storage elements is above or below a specified verify level. In another approach, the criterion is a specified number of program pulses. For example, the bit combination may be re-used for the B state for four program pulses, after which it is re-used for the C state storage elements.

Re-use of a bit combination by storage elements of multiple target data states provides the benefit of more precise control and flexibility to be shared by storage elements in the multiple target data states.

Generally, a bit combination is a sequence or string of two or more bits. The number of different bit combinations which can be stored in k latches is $2^k$. For example, in the example sets of latches of FIG. 3A, two latches (LP and UP) each store a bit of data in a first bit combination which identifies a target data state. For example, referring also to FIG. 4B, bit combinations 11, 01, 00 and 10 represent the E, A, B and C states, where the first bit in the bit combination represents the LP bit and the second bit in the bit combination represents the UP bit. A bit combination can be written with the lower page bit first followed by one or more higher page bits, or with the higher page bit first followed by one or more lower page bits.

Additionally, two latches (QPW1 and QPW2) each store a bit of data in a second bit combination which identifies a count of program pulses which are applied to a storage element. For example, referring to FIGS. 15A and 15B, bit combinations QPW1/QPW2=00, 01, 11, and 10 represent a count of 0, 1, 2 or 3, respectively.

In this approach, assume one storage element (e.g., 230 in FIG. 2A) is being programmed to a respective target data state (e.g., B or C). Other non-volatile storage elements (e.g., 240, 250 in FIG. 2A) in a program operation reach a target data state (A) before the one non-volatile storage element reaches its target data state (B, C). Further, a set of latches (e.g., set 194, 195 and 196 for storage elements 230, 240 and 250, respectively) for each storage element comprise a number N1≥1 latches (QPW1, QPW2) which each store a bit of data, and a count of program pulses in the slow programming mode zone is determined from the N1 latches. Each set of latches also comprises a number N2≥2 latches (LP, UP) which each store a bit of data, where the target data state of the one non-volatile storage element is determined from the N2 latches.

When programming is not yet completed for the other non-volatile storage elements: the N2 latches comprise one bit combination (e.g., 00 or 01) to identify the target data state (e.g., B or C) of the one non-volatile storage element. The one bit combination (00 or 01) is different than another bit combination (e.g., 10 for the A state) which identifies the target data state of the other non-volatile storage elements in their respective sets of latches (195, 196). When programming is completed for the other (A state) non-volatile storage elements: the N2 latches comprise the another bit combination to identify the target data state of the one non-volatile storage element and to provide, in combination with the N1 latches, an additional value for the count. That is, the 10 combination now identifies the B state, for instance, instead of the A state.

The A state does not need to be identified at this point since programming is completed for the A state. The state machine, for instance, can include logic which cause the update of the latches and now interprets LP/UP=10 in combination with the QPW latch or latches to provide the new count value. For example, in FIG. 14A, the LP/UP/QPW bit combination of 001 represents a count of one (Bqpw1) and the LP/UP/QPW bit combination of 101 represents a count of two (Bqpw2). The B state thus can count up to two program pulses due to the re-use of the A state bit combination while the C state, for instance, only counts up to one. Or, in the example of FIGS. 15B and 15C, the B state can count up to four program pulses due to the re-use of the A state bit combination while the C state, for instance, only counts up to three. The concept can be extended to the use of more than two QPW latches as well.

Note that, for the B state, the count is not based on the N2 latches (LP and UP) when the programming of the other non-volatile storage elements is not yet completed. The N2 latches (LP and UP) only identify the target data state when the programming of the other non-volatile storage elements is not yet completed, and the count is based only on the QPW1 latch. For example, in FIG. 14A, the B state count is 0 or 1 when QPW1 is 0 or 1, respectively. Or, with the bit combination re-use, the B state count is 2 when LP/UP/QPW1 is 101. In FIGS. 15B and 15C, the B state count is 0, 1, 2 or 3 when the QPW1/QPW2 bit combination is 00, 10, 11 or 01, respectively. Or, with the bit combination re-use, the B state count is 4 when LP/UP/QPW1/QPW2 is 1001.

Figure 8C:
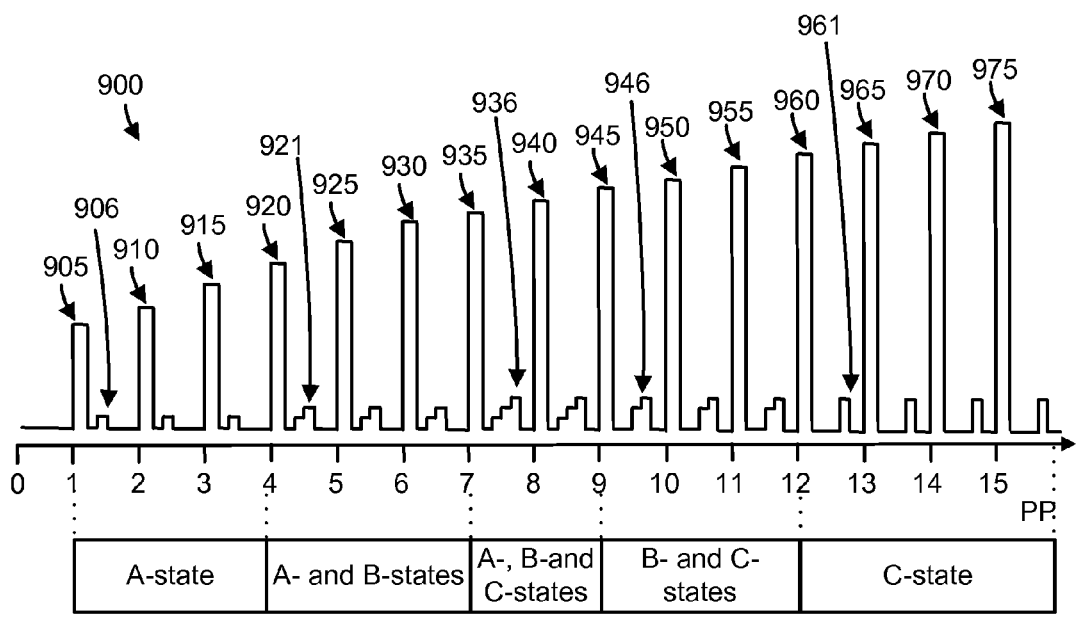
FIG. 8C depicts a program operation in which verify operations are performed for different target data states as the program operation progresses, and where a bit combination can be re-used according to the programming progress.

FIG. 8C depicts a program operation in which verify operations are performed for different target data states as the program operation progresses, and where a bit combination can be re-used according to the programming progress. The horizontal axis depicts program pulse number and the vertical axis depicts control gate or word line voltage. Generally, a program operation can involve applying a pulse train to a selected word line, where the pulse train includes multiple program-verify iterations. The program portion of the program-verify iteration comprises a program pulse, and the verify portion of the program-verify iteration comprises one or more verify pulses.

For each program pulse, a square waveform is depicted, although other shapes are possible such as a multilevel shape or a ramped shape. A pulse train typically includes program pulses which increase stepwise in amplitude in each program-verify iteration using a fixed of varying step size. A new pulse train can be applied in each programming pass of a multi-pass program operation, starting at an initial Vpg level and ending at a final Vpg level which does not exceed a maximum allowed level. The initial Vpg levels can be the same or different in different programming passes. The final Vpg levels can also be the same or different in different programming passes. The step size can be the same or different in the different programming passes. In some cases, a smaller step size is used in a final programming pass to reduce Vth distribution widths.

The pulse train 900 includes a series of program pulses 905, 910, 915, 920, 925, 930, 935, 940, 945, 950, 955, 960, 965, 970 and 975 that are applied to a word line selected for programming, and an associated set of non-volatile storage elements. One, two or three verify levels are provided after each program pulse as an example, based on the target data states which are being verified. 0 V may be applied to the selected word line between the program and verify pulses. For example, an A-state verify pulse (e.g., waveform 906) may be applied after each of the first, second and third program pulses 905, 910 and 915, respectively. A- and B-state verify pulses (e.g., waveform 921) may be applied after each of the fourth, fifth and sixth program pulses 920, 925 and 930, respectively. A-, B- and C-state verify pulses (e.g., waveform 936) may be applied after each of the seventh and eighth program pulses 935 and 940, respectively. B- and C-state verify pulses (e.g., waveform 946) may be applied after each of the ninth, tenth and eleventh program pulses 945, 950 and 955, respectively. Finally, a C-state verify pulse (e.g., waveform 961) may be applied after each of the twelfth, thirteenth, fourteenth and fifteenth program pulses 960, 965, 970 and 975, respectively.

In this example, the A state storage elements complete programming after the eighth program pulse so that their bit combination can be re-used starting with the ninth program pulse for the B or C state storage elements. In another example, the B state storage elements complete programming after the eleventh program pulse so that their bit combination (along with the A state bit combination) can be re-used starting with the twelfth program pulse for the C state storage elements.

Figure 9A:
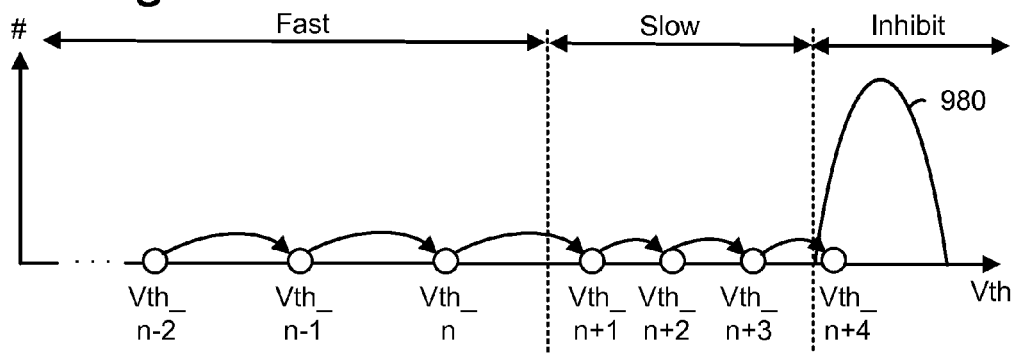
FIG. 9A depicts a progress of a Vth of a storage element in a program operation where fast and slow programming modes are used, as a result of the program voltage depicted in FIG. 9B and the bit line voltage depicted in 9C, where different bit line voltages $Vbl\_s1$, $Vbl\_s2$ and $Vbl\_s3$ having a common step size are used during a slow programming mode as a function of a count of program pulses in a slow programming mode.
Figure 9B:
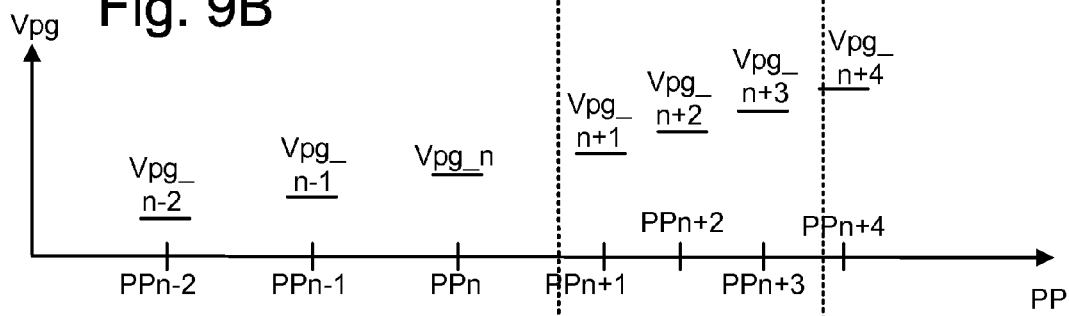
FIG. 9D depicts a variation in the bit line voltages used in the slow programming mode of FIG. 9C as a function of the Vpg step size.

FIG. 9A depicts a progress of a Vth of a storage element in a program operation where fast and slow programming modes are used, as a result of the program voltage depicted in FIG. 9B and the bit line voltage depicted in 9C, where different bit line voltages Vbl_s1, Vbl_s2 and Vbl_s3 having a common step size are used during a slow programming mode as a function of a count of program pulses in a slow programming mode. A distribution 980 results. For example, the count is 1, 2 or 3 for PPn+1, PPn2 or PPn+3, respectively, and Vbl_s1, Vbl_s2 or Vbl_s3 is used when the count is 1, 2 or 3, respectively. A count of up to three can be provided using two dedicated latches. A count of three is believed to provide a good balance between providing additional control of Vth and minimizing overhead costs. However, a higher maximum count can be used as well. For example, a count of up to seven can be provided using three dedicated latches.

Figure 9C:
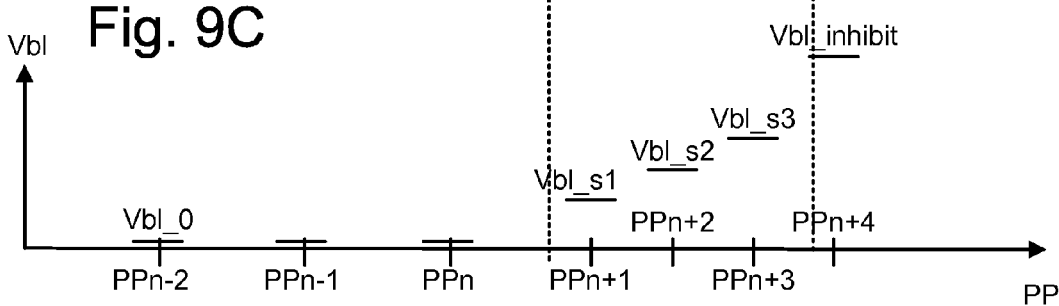

FIGS. 9C and 10B provide an example of the voltage of the bit line being stepped up in three different program pulses (PPn+1 to PPn+3) of the additional program pulses in the slow programming mode. The different program pulses in which Vbl is stepped up are adjacent in these examples but need not be adjacent.

FIG. 9C provides an example of the voltage of the bit line being set to a first stepped up level (Vbl_s1) when a first program pulse (PPn+1) of the additional program pulses is applied to the one non-volatile storage element, the voltage of the bit line being set to a second stepped up level (Vbl_s2), higher than the first stepped up level, when a second program pulse (PPn+2) of the additional program pulses is applied to the one non-volatile storage element, and the voltage of the bit line being set to a third stepped up level (Vbl_s3), higher than the second stepped up level, when a third program pulse (PPn+3) of the additional program pulses is applied to the one non-volatile storage element. FIG. 10B provides a similar example with first, second and third bit lines levels of Vbl_s1, Vbl_s2 and Vbl_s3a.

Once Vbl reaches a maximum level in the slow programming mode for a storage element, it can be maintained at that level for one or more subsequent program pulses until the Vth of the storage element reaches the higher verify level, or until programming is considered to be complete for a population of storage elements of the same target data state. Thus, Vbl_s3 (FIG. 9C) can be used for these one or more subsequent program pulses in the slow programming mode. In this case, the voltage of the bit line is stepped up until a maximum level which allows programming of the one non-volatile storage element is reached, after which the voltage of the bit line is set at the maximum level during each of one or more subsequent program pulses which are applied to the one non-volatile storage element, until the Vth of the one non-volatile storage element exceeds a higher verify level of the target data state.

In the example of FIG. 7A to 7C, a fixed Vbl (Vbl_s) is applied on the bit lines associated with the storage elements in the slow programming mode. The Vbl is the same regardless of whether the storage element is in the slow programming mode for one program pulse or more than one program pulse. The Vbl is therefore independent of the number of program pulses that have been applied to a storage element in the slow programming mode. In contrast, the approach of FIGS. 9A to 9C sets Vbl as a function of a count of the number of program pulses that are applied to a storage element in slow programming mode. Each storage element can be tracked to determine the number of program pulses that the storage element has experienced in the slow programming mode. Based on the count for each storage element, its associated bit line can be biased at different levels. In one approach, the Vbl is stepped up based on the count, e.g., one step up per increase in the count. For instance, in FIG. 9C, when the first program pulse (PPn+1) having an amplitude Vpg_n+1 is applied to a storage element, the Vbl is set at Vbl_s1 (e.g., 0.4 V). When the second program pulse (PPn+2) having an amplitude Vpg_n+2 is applied to the storage element, the Vbl is set at Vbl_s2 (e.g., 0.6 V). When the third program pulse (PPn+3) having an amplitude Vpg_n+3 is applied to the storage element, the Vbl is set at Vbl_s3 (e.g., 0.8 V). The third program pulse causes the Vth of the storage element to reach Vth_n+4, which exceeds VH, so that the storage element is inhibited from programming when the next program pulse is applied. Specifically, when the next program pulse (PPn+4) having an amplitude Vpg_n+4 is applied to the storage element, the Vbl is set at Vbl_inhibit. Generally, an inhibited storage element will continue to receive a program pulse as remaining storage elements continue to be programmed via the same word line.

By incrementing the Vbl as a function of the count, the Vth jumps of a storage element can be made substantially uniform, so that the effectiveness of the slow programming mode is almost independent of the count. This improves the overall effectiveness of the slow programming mode, resulting in tighter Vth distributions tighter.

Figure 12A:
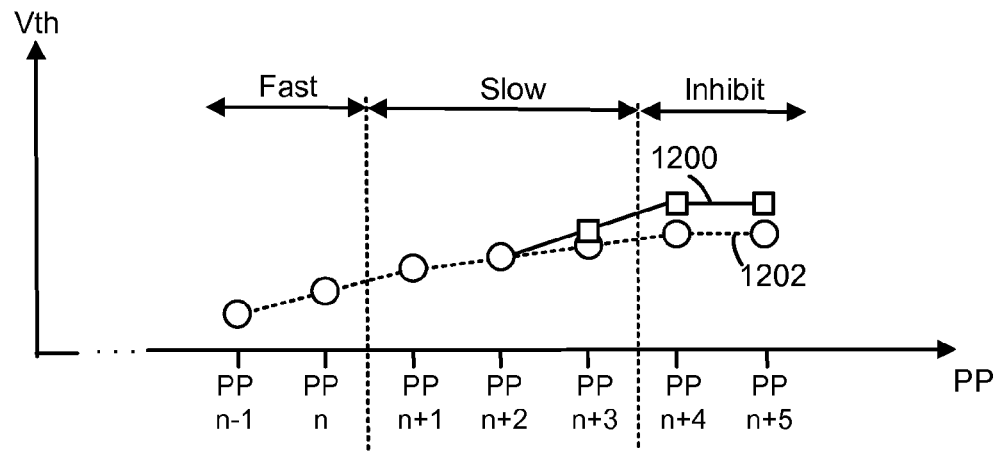
FIG. 12A depicts a progress of the increase in a Vth of a storage element as a function of a program pulse number, comparing a case (line 1200) in which a single bit line voltage is used during a slow programming mode and a case (line 1202) in which different bit line voltages are used during a slow programming mode as a function of a count of program pulses in the slow programming mode.
Figure 12B:
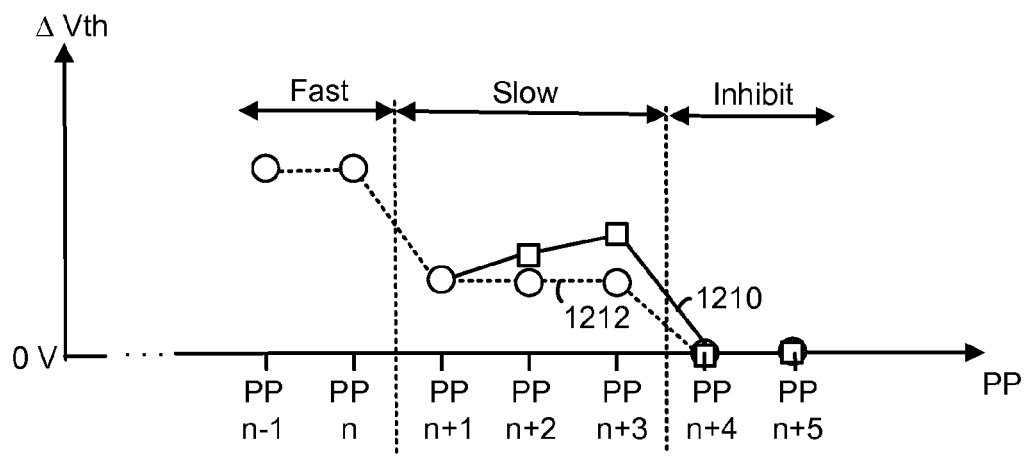
FIG. 12B depicts a change in a Vth of a storage element as a function of a program pulse number, comparing a case (line 1210) in which a single bit line voltage is used during a slow programming mode and a case (line 1212) in which different bit line voltages are used during a slow programming mode as a function of a count of program pulses in the slow programming mode.

For example, see FIGS. 12A and 12B. Lines 1200 and 1210 represent the case of FIG. 7A to 7C where a single Vbl is used in the slow programming mode, and lines 1202 and 1212 represents the case of FIG. 9A to 9C where different Vbl levels are used in the slow programming mode. In the former case, once the storage element enters the slow programming mode, the Vth of the storage element initially increases at a reduced rate and then at a gradually higher rate which approximates the rate in the fast programming mode. In the latter cases, once the storage element enters the slow programming mode, the Vth of the storage element increases at a reduced rate throughout the slow programming mode. Vth does not increase in the inhibit zone.

Since the rate of change of Vth ($\Delta$Vth) can be maintained at a relatively constant level throughout the slow programming mode, the effectiveness of the slow programming mode will be independent of the number of program pulses in the slow programming mode. Thus, a narrow Vth can be achieved even when different storage elements receive a different number of program pulses in the slow programming mode.

In the example of FIGS. 9A to 9C, assume that the Vbl steps up by a fixed amount for each program pulse, e.g., Vbl_s2−Vbl_s1=Vbl_s3−Vbl_s2. However, other scenarios are possible as described below. The drawings are not necessarily to scale, but Vbl_s1 will be generally higher than Vbl step size.

Figure 9D:
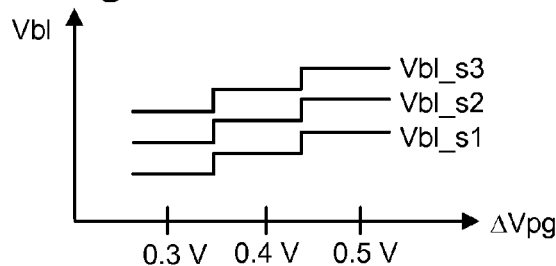

FIG. 9D depicts a variation in the bit line voltages used in the slow programming mode of FIG. 9C as a function of the Vpg step size. The horizontal axis depicts example values for $\Delta$Vpg is and the vertical axis depicts $\Delta$Vbl. An optimal level of the Vbl step size (e.g., an optimal level of Vbl) during the slow programming mode may be a function of the Vpg step size. In general, a higher $\Delta$Vbl should be used when a higher $\Delta$Vpg is used. $\Delta$Vbl can be less than, the same as, or greater than $\Delta$Vpg. Moreover, $\Delta$Vpg can be fixed or varying during a program operation in which case Vbl_s1, Vbl_s2 and Vbl_s3 can also be fixed or varying. In this case, for one program pulse of the additional program pulses, the voltage of the bit line is stepped up by a step size which is a function of a step size of the one program pulse.

A further option is to provide a Vbl step size based on the target data state. Testing can be done to determine an optimize Vbl step size as a function of target data state. This can further optimize the accuracy of a program operation. Different data states can also be grouped, where each group uses a same set of Vbl step sizes in the slow programming mode. This can reduce overhead data requirements.

FIG. 10A depicts bit line voltages which can be used in a slow programming mode, where a same bit line voltage Vbl_s1 is used during two program pulses (PPn+1 and PPn+2) after which a higher bit line voltage Vbl_s2 is used during a subsequent program pulse (PPn+3). This is an example of the voltage of the bit line being stepped up in non-adjacent program pulses (PPn+1 and PPn+3) of the additional program pulses, and not stepped up in a program pulse (PPn+2) which is between the non-adjacent program pulses. Generally, a given Vbl can be used for multiple successive program pulses in the slow programming mode. This approach reduces the number of Vbl levels from three to two, compared to the example of FIG. 9C. This is advantageous in reducing the amount of circuitry which is needed to provide different bit line voltages while still providing the benefits of more uniform jumps in Vth.

FIG. 10B depicts bit line voltages which can be used in a slow programming mode, where different bit line voltages Vbl_s2 and Vbl_s3 having increasingly smaller step sizes are used during a slow programming mode. This approach increases the level of Vbl with each program pulse in the slow programming mode, but the second step size is less than the first step size. That is, Vbl_s2−Vbl_s1>Vbl_s3a−Vbl_s2.

This approach is advantageous in preventing Vbl from becoming too high while providing a relatively strong initial slowdown in programming. Generally, Vbl_s1 can be higher than the step sizes that are defined within the slow programming zone, because many cells (including those that received only one program pulse in slow programming zone) will only see Vbl_s1. Hence, Vbl_s1 should not be too low. Vbl_s1 should be high enough to impart a significant slow down. For example, Vbl_s1=0.4 V can be used. The subsequent step sizes can be about 0.1-0.2 V, for instance.

FIG. 10B provides an example of the voltage of the bit line being stepped up by different step sizes during the additional program pulses.

It is also possible to have a third stepped up level (Vbl_s3b) exceeding a second stepped up level (Vbl_s2a) by a respective step size (Vbl_s3b−Vbl_s2a), the second stepped up level exceeding a first stepped up level (Vbl_s1) by a respective step size (Vbl_s2a−Vbl_s1), and a first stepped up level exceeding an initial level (Vbl_0) by a step size (Vbl_s1−Vbl_0) which is larger than the respective step sizes of the second and third stepped up levels.

Figure 11A:
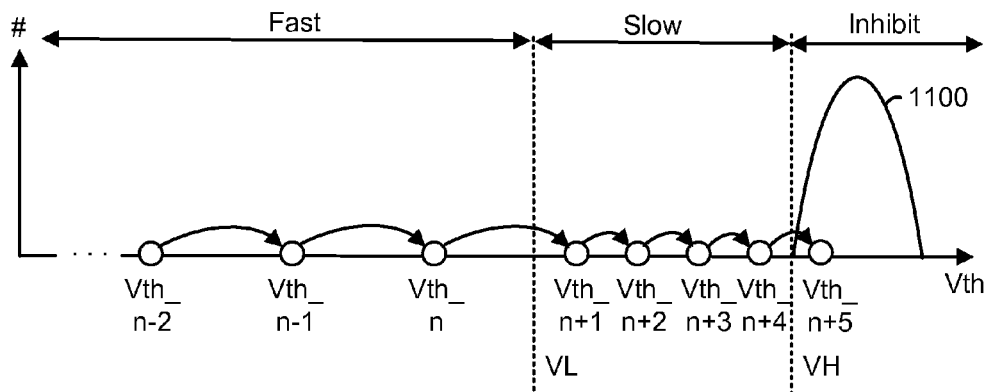
FIG. 11A depicts a progress of a Vth of a storage element in a program operation where fast and slow programming modes are used, as a result of the program voltage depicted in FIG. 11B and the bit line voltage depicted in 11C, where a same bit line voltage $Vbl\_s1$ is used during two program pulses after which a same bit line voltage $Vbl\_s2$ is used during two subsequent program pulses, during a slow programming mode as a function of a count of program pulses in the slow programming mode.
Figure 11B:
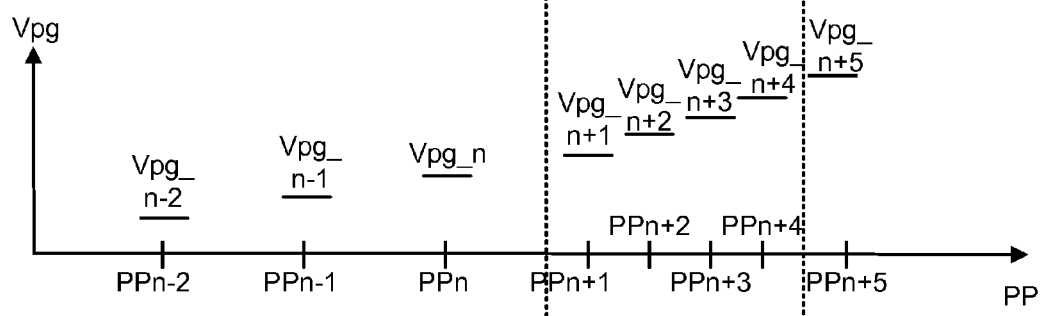

FIG. 11A depicts a progress of a Vth of a storage element in a program operation where fast and slow programming modes are used, as a result of the program voltage depicted in FIG. 11B and the bit line voltage depicted in 11C, where a same bit line voltage Vbl_s1 is used during two program pulses after which a same bit line voltage Vbl_s2 is used during two subsequent program pulses, during a slow programming mode as a function of a count of program pulses in the slow programming mode. A final Vth distribution 1100 is obtained for a set of storage elements having a same target data state. Generally, Vbl can be stepped up on every alternate program pulse. For example, for count=0,1 use Vbl=0.4 V and for ount=2,3, use Vbl=0.6 V.

In this example, four program pulses are applied in the slow programming mode instead of three as in prior examples. Specifically, PPn+1 through PPn+4 are applied in the slow programming mode to a storage element having Vth values of Vth_n+1 through Vth_n+4, respectively. The bit line voltage is Vbl_s1 during PPn+1 and PPn+2 and Vbl_s2 during PPn+3 and PPn+4. This pattern involves setting Vbl at the same level for two program pulses, then stepping up Vbl and applying a stepped up level for two program pulses. This approach is advantageous in preventing Vbl from becoming too high and can reduce the number of Vbl levels which are needed to two levels, allowing a simpler implementation.

Generally, after the first step up in Vbl for the slow programming mode, the second and later step ups may be smaller (or in general, different) than the first step up. This approach avoids Vbl becoming too high, which could inhibit programming.

Figure 11C:
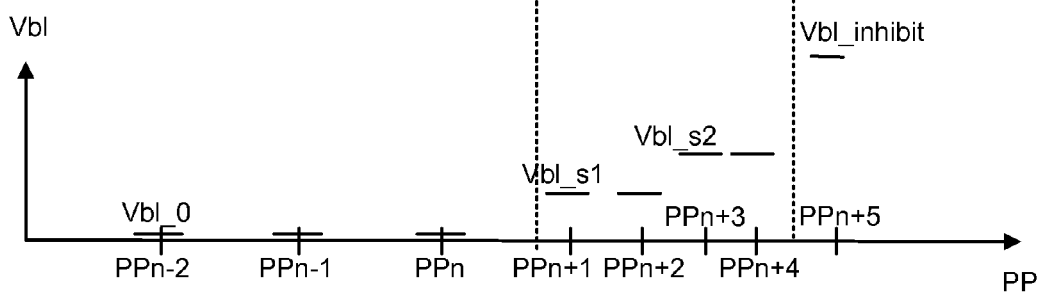

FIG. 11C provides an example of the voltage of the bit line being stepped up in non-adjacent program pulses (PPn+1 and PPn+3) of the additional program pulses, and not stepped up in a program pulse (PPn+2) which is between the non-adjacent program pulses.

FIG. 12A depicts a progress of the increase in a Vth of a storage element as a function of a program pulse number, comparing a case (line 1200) in which a single bit line voltage is used during a slow programming mode and a case (line 1202) in which different bit line voltages are used during a slow programming mode as a function of a count of program pulses in the slow programming mode. As discussed, the use of multiple Vbl levels in the slow programming mode results in maintaining a reduced rate of increase in Vth during the slow programming mode. The use of a single Vbl level in the slow programming mode results in an initial low rate of increase in Vth, following by higher rates of increase.

FIG. 12B depicts a change in a Vth of a storage element as a function of a program pulse number, comparing a case (line 1210) in which a single bit line voltage is used during a slow programming mode and a case (line 1212) in which different bit line voltages are used during a slow programming mode as a function of a count of program pulses in the slow programming mode. ΔVth is at a high level during the fast programming mode, when PPn−1 and PPn are applied, and at a relatively constant low level in the slow programming mode, when PPn+1 to PPn+3 are applied. ΔVth is at 0 V during the inhibit mode, when PPn+4 and PPn+5 are applied. Inhibiting programming is the same as stopping programming as distinguished from slowing programming.

FIG. 13 depicts values in data latches during a program operation where a single latch is used to indicate whether the fast or slow programming mode is active. The table includes rows with bit values for a set of latches comprising LP, UP and QPW1. The table includes columns for different target data states. For a given data state, a progression of bit values in the associated latches for each storage element moves from left to right. For example, a B state storage elements moves from B to Bqpw to Binh. It is possible but unlikely that a storage element will jump directly from the fast programming mode to the inhibit mode so that it does not receive any program pulses in the slow programming mode.

The bit values in the LP and UP latches identify a target data state. LP/UP=11, 10, 00 or 01 identifies the Er, A, B or C state, respectively. LP/UP is updated to 11 when programming is complete for a storage element having the A, B or C target data state, respectively. The bit value in the QPW1 latch indicates whether the associated storage element is in the slow programming mode. QPW1=0 indicates the storage element is in the fast programming mode (as long as LP/UP≠11). QPW1=1 indicates the storage element is in the slow programming mode (as long as LP/UP≠11). QPW1=represents a count of one program pulse in the slow programming mode. For example, for an A state storage element, QPW1 is flipped from 0 to 1 to indicate that the storage element is in the slow programming mode. An Er state storage element is inhibited throughout a program operation. The column headings A, Aqpw (where qpw denotes quick pass write) and Ainh denote an A state storage element in the fast programming, slow programming and inhibit modes. Similarly, the column headings B, Bqpw and Binh denote a B state storage element in the fast programming, slow programming and inhibit modes. The column headings C, Cqpw and Cinh denote a C state storage element in the fast programming, slow programming and inhibit modes.

This arrangement of latches is not very flexible as it allows counting of only one program pulse in the slow programming mode. However, greater flexibility can be achieved by allowing counting of up to two program pulses in the slow programming mode as discussed next.

FIG. 14A depicts values in data latches during a program operation in which a bit combination from the "A" state is re-used for the "B" state to provide a count of up to two program pulses in the slow programming mode, in combination with the QPW1 latch. As discussed, re-use of bit combination allows for counting of additional program pulses. Here, the LP/UP bit combination of 10 is re-used to provide a new column Bqpw2. The presence of the bit combination LP/UP/QPW1=101 indicates to the state machine or other controller that a second (or later) program pulse is being applied to a B state storage element in the slow programming mode. The bit combination LP/UP/QPW1=101 is not confused with the same combination under the column Aqpw because programming of the A state storage elements has been completed.

FIG. 14B depicts values in data latches during a program operation in which a bit combination from the "A" state is re-used for the "C" state to provide a count of up to two program pulses in the slow programming mode, in combination with a single latch which is used to indicate whether the fast or slow programming mode is active. This example is similar to the previous example except the bit combination is re-used to provide an additional count value for the C state storage elements which have not completed programming. Specifically, the LP/UP bit combination of 10 is re-used to provide a new column Cqpw2. The presence of the bit combination LP/UP/QPW1=101 indicates to the state machine or other controller that a second (or later) program pulse is being applied to a C state storage element in the slow programming mode.

FIG. 15A depicts values in data latches for states E, A and B during a program operation where two latches are used to provide a count of up to three program pulses in a slow programming mode. The table includes rows with bit values for a set of latches comprising LP, UP, QPW1 and QPW2. As before, the bit values in the LP/UP latches identify a target data state. The bit values in the QPW1/QPW2 latches indicate the count of program pulses for the associated storage element, in the slow programming mode. QPW1/QPW2 values of 00 are used to indicate that the storage element has not entered the slow programming mode yet. QPW1/QPW2 values of 10, 11 and 01, indicate that the associated storage element is in the first, second or third (or later) program pulse, respectively, of the slow programming mode. Thus, the set of latches (QPW1, QPW2) associated with the one non-volatile storage element stores four two-bit combinations indicating whether the count is zero, one, two or three.

For example, the column headings Aqpw1, Aqpw2 and Aqpw3 denote an A state storage element in the first, second or third program pulse of the slow programming mode (e.g., a count of one, two or three, respectively). For an A state storage element, QPW1 is flipped from 0 to 1 to indicate that the next program pulse is a first program pulse in the slow programming mode, then QPW2 is flipped from 0 to 1 to indicate that the next program pulse s a second program pulse in the slow programming mode, then QPW1 is flipped from 1 to 0 to indicate that the next program pulse is a third or later program pulse in the slow programming mode. The column headings Bqpw1, Bqpw2 and Bqpw3 denote a B state storage element in the first, second or third (or later) program pulse of the slow programming mode.

FIG. 15B depicts a continuation of the table of FIG. 15A, showing values in data latches for state C. The column headings Cqpw1, Cqpw2 and Cqpw3 denote a C state storage element in the first, second or third (or later) program pulse of the slow programming mode.

FIG. 15C depicts values in data latches during a program operation in which a bit combination from the "A" state is re-used for the "B" state to provide a count of up to four program pulses in the slow programming mode, in combination with QPW1/QPW2 latches. The latch values for the C state are as depicted in FIG. 15B. This example is similar to that of FIG. 14A except there are two latches (QPW1/QPW2) used to count the number of program pulses in the slow programming mode. When programming of the A state storage elements is completed, the bit combination LP/UP=10 is re-used to provide the column Bqpw4 which counts a fourth (or later) program pulse in the slow programming mode.

FIGS. 16A to 16D depict values in data latches for states Er and A through G during a program operation where two latches are used to provide a count of up to three program pulses in a slow programming mode. Here, there are eight data states, such as in a three bit per cell memory. Three latches LP/MP/UP are used to identify the target data state and two latches QPW1/QPW2 are used to count the number of program pulses in the slow programming mode. The columns A, B, C, D, E, F and G denote the bit values in the latches during a fast programming mode of a storage element having the respective target data state. The columns Aqpw1, Bqpw1, Cqpw1, Dqpw1, Eqpw1, Fqpw1 and Gqpw1 denote the bit values in the latches during a count=1 in the slow programming mode of a storage element having the respective target data state. The columns Aqpw2, Bqpw2, Cqpw2, Dqpw2, Eqpw2, Fqpw2 and Gqpw2 denote the bit values in the latches during a count=2 in the slow programming mode of a storage element having the respective target data state. The columns Aqpw3, Bqpw3, Cqpw3, Dqpw3, Eqpw3, Fqpw3 and Gqpw3 denote the bit values in the latches during a count=3 (or more) in the slow programming mode of a storage element having the respective target data state. The columns Ainh, Binh, Cinh, Dinh, Einh, Finh and Ginh denote the bit values in the latches during the inhibit mode of a storage element having the respective target data state.

FIG. 17 depicts values in data latches during a program operation in which a bit combination from the "A" state is re-used for the "B" state to provide a count of one program pulse in the slow programming mode. In this example, the re-use of a bit combination provides the ability to provide a count of one. Thus, a memory device which does not have any latches dedicated to provide a count can still provide a count. In this example, when programming of the A state storage elements is completed, the bit combination from LP/UP of 10 is re-used to provide a count of one under the column Bqpw.

These data latches can be used in a method for programming a set of non-volatile storage elements in a non-volatile storage device. The method includes: (a) storing one bit combination (1 0) identifying one target data state (A) in one set of latches (LP/UP) associated with each non-volatile storage element to be programmed to the one target data state; (b) storing another bit combination (0 0) identifying another target data state (B) in another set of latches (LP/UP) associated with each non-volatile storage element to be programmed to the another target data state; (c) performing initial program-verify iterations (e.g., PP1 to PP8 in FIG. 8C) of a program operation for the non-volatile storage elements to be programmed to the one target data state and the non-volatile storage elements to be programmed to the another target data state until the non-volatile storage elements to be programmed to the one target data have completed programming (e.g., their Vth exceeds VvaH); (d) during the initial program-verify iterations, changing the one bit combination (10) in the one set of latches to a lockout bit combination (11) for each non-volatile storage element to be programmed to the one target data state when a respective Vth is verified to have reached a verify level (VvaH) associated with the one target data state (A); (e) in response to the non-volatile storage elements to be programmed to the one target data state completing programming to the one target data state, performing additional program-verify iterations (e.g., PP9 to PP15 in FIG. 8C) of the program operation for non-volatile storage elements which have not completed programming among the non-volatile storage elements to be programmed to the another target data state; and (f) during the additional program-verify iterations, changing the another bit combination (00) in the another set of latches to the one bit combination (10) for the non-volatile storage elements which have not completed programming when a respective Vth is verified to have reached a lower verify level (VvbL, VvcL) associated with the one target data state, and changing the one bit combination (10) in the another set of latches to the lockout bit combination (11) for the non-volatile storage elements which have not completed programming when a respective Vth is verified to have reached a higher verify level (VvbH, VvcH) associated with the one target data state after being verified to have reached the lower verify level (VvbL, VvcL) associated with the one target data state.

In this method, the non-volatile storage elements to be programmed to the one target data state and the non-volatile storage elements to be programmed to the another target data state are connected to a selected word line; the initial program-verify iterations apply an initial plurality of program pulses to the selected word line; and the additional program-verify iterations apply an additional plurality of program pulses to the selected word line.

Figure 18A:
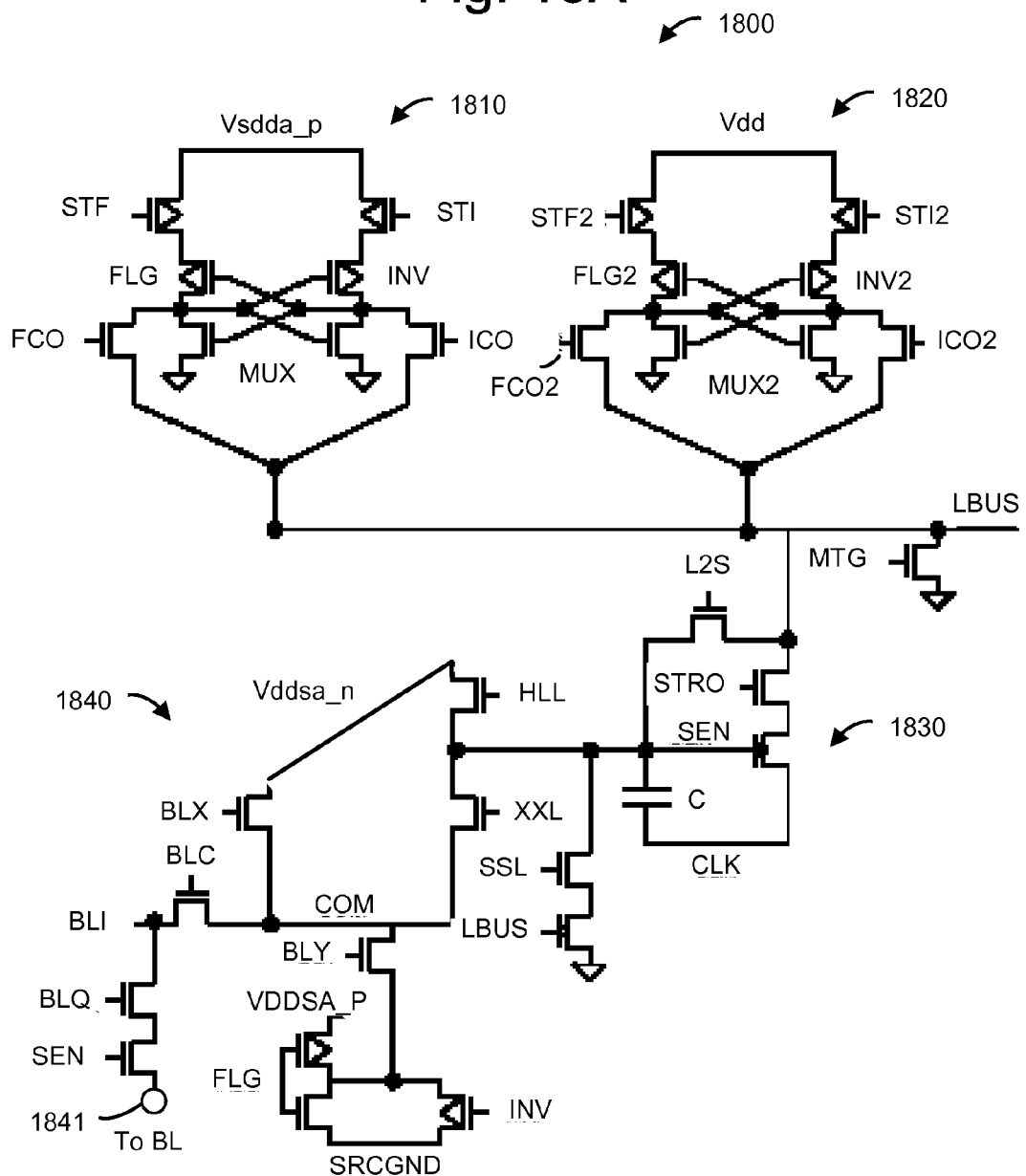
FIG. 18A depicts example circuitry for providing the sense module SM0 of FIG. 3A.

FIG. 18A depicts example circuitry for providing the sense module SM0 of FIG. 3A. Generally, a tradeoff can be made between the number of different bit line voltages in the slow programming mode and the design complexity. Moreover, the number of different bit line voltages in the slow programming mode can be less than the number of program pulses which can be counted in the slow programming mode. For example, two bit line voltages can be provided even when three program pulses can be counted. In FIGS. 10A and 11C, for instance, Vbl_s1 and Vbl_s2 are the two bit line voltages in the slow programming mode.

The example circuitry 1800 can provide two bit line voltages (e.g., 0.6 V and 0.8 V) in the slow programming mode, in addition to an inhibit voltage Vdd and a ground voltage for the fast programming mode. The circuitry 1800 includes regions 1810, 1820, 1830 and 1840.

A region 1810 is concerned with providing a slow programming mode supply voltage Vddsa_p to a bit line at node 1841 using transistors STF, STI, FLG, INV, FCO and ICO. STF receives an appropriate control signal to provide the desired level of FLG. FLG is a latch which sets a flag value to high or low. INV is the inverse of FLG. ICO controls whether INV communicates with a multiplexer (MUX). FCO controls whether FLG communicates with the MUX. An output of the region 1810 communicates with a local bus LBUS.

A region 1820 is concerned with providing the inhibit voltage Vdd to the bit line at node 1841 using transistors STF2, STI2, FLG2, INV2, FCO2 and ICO2. STF2 receives an appropriate control signal to provide the desired level of FLG2. FLG2 is a latch which sets a flag value to high or low. INV2 is the inverse of FLG2. ICO2 controls whether INV2 communicates with a multiplexer (MUX2). FCO2 controls whether FLG2 communicates with MUX2. An output of the region 1820 communicates with LBUS.

A region 1830 is concerned with input and output of data using transistors L2S and STRO. In the region 1830, the sense node SEN works as dynamic latch during programming. LBUS provides input/output of data to/from the circuit 1800.

A region 1840 is concerned with providing another slow programming mode supply voltage VDDSA_N or a ground voltage SRCGRD to the bit line at node 1841 using transistors BLQ, BLI, BLC, BLX, BLY, INV, XXL, L2S and HLL and node SEN. STRO controls whether the sense path communicates with LBUS. A clock CLK signal is provided to a dynamic capacitor C. XXL controls whether the sense path communicates with the COM path. HLL controls whether the sense path communicates with a power supply node at Vddsa_n.

BLY controls communication with the COM path. BLX controls whether the COM path communicates with Vddsa_n. BLC controls whether the COM path communicates with the bit line BL. The bit line may communicate with one or more NAND strings.

The transistors depicted can include n-type metal-oxide-semiconductor field-effect transistor (MOSFETs) and partially-insulated field-effect transistors (PiFETs), for instance. For example, STF is an example of a PiFET, and the symbol used to identify it is as a PiFET is used elsewhere in FIG. 18A to identify other PiFETs. Also, FCO is an example of an nMOS, and the symbol used to identify it is as an nMOS is used elsewhere in FIG. 18A to identify other nMOSs.

FIG. 18B depicts voltages relating to the circuitry of FIG. 18A during a program operation, e.g., during the program portion of a program-verify iteration. The horizontal direction depicts time and the vertical direction depicts voltage. Waveforms 1870, 1871, 1872, 1873, 1874, 1875, 1876 and 1877 denotes the voltages for BLC, BLY, BLQ, VQPW2, BL(inhibit), BL(QPW1), BL(QPW2) and BL(PROG), respectively. A dashed line denotes a floating voltage and a solid line denotes driven voltage. The time period t0-t1 is used for an inhibited bit line pre-charge. The time period t1-t2 is used to set FLG2 and SEN. The time period t2-t3 is used for a QPW2 pre-charge. The time period t3-t4 is used for a QPW1 pre-charge. In this example, Vbl(inhibit) is coupled higher by a neighbor bit line at t2 and BL(QPW2) experiences a brief, temporary increase at t3 due to coupling from a neighbor bit line.

FIG. 18C depicts values for the FLG and SEN nodes of FIG. 18A during different phases of the program portion of FIG. 18B. To speed performance, the SEN update can be done in parallel with the initial bit line pre-charge, and the FLG update can be done in parallel with the QPW2 pre-charge. Moreover, we can pre-charge QPW2 first and then QPW1 to overcome a bit line-to-bit line coupling concern. As depicted, the inhibit mode is set when SEN=0 and FLG=0 at t041, when the bit line is pre-charged to Vddsa_p. The QPW1 slow programming mode is set when SEN=0 and FLG=1 at t3. The QPW2 slow programming mode is set when SEN=1 and FLG=1 at t2 and the inhibit mode is set when SEN=0 and FLG=0.

Accordingly, it can be seen that, in one embodiment, a method for programming in a non-volatile storage device comprises: in a program operation, applying one or more initial program pulses to one non-volatile storage element; during each program pulse of the one or more initial program pulses, setting a voltage of a bit line associated with the one non-volatile storage element at an initial level (0 V) which allows programming of the one non-volatile storage element; determining when a Vth of the one non-volatile storage element exceeds a lower verify level (VvaL, VvbL, VvcL) of a target data state (A, B, C) of the one non-volatile storage element; and when the Vth of the one non-volatile storage element exceeds the lower verify level, applying additional program pulses to the one non-volatile storage element, maintaining a count of a number of the additional program pulses which are applied to the one non-volatile storage element, and during the additional program pulses, setting the voltage of the bit line at one or more stepped up levels as a function of the count, the one or more stepped up levels are stepped up from the initial level and allow programming of the one non-volatile storage element.

In another embodiment, a non-volatile storage system comprises: a set of non-volatile storage elements in communication with a word line; a respective bit line associated with each non-volatile storage element; and a control circuit, the control circuit: sets a voltage of one of the respective bit lines which is associated with one non-volatile storage element at an initial level which allows programming of the one non-volatile storage element during one or more initial program pulses which are applied to the word line when a Vth of the one non-volatile storage element is verified to be below a lower verify level, and sets the voltage of the bit line at different stepped up levels which allow programming of the one non-volatile storage element during additional program pulses which are applied to the word line when the Vth of the one non-volatile storage element is verified to be between the lower verify level and a higher verify level.

In another embodiment, a method for programming in a non-volatile storage device comprises: performing one or more program-verify iterations for a non-volatile storage element in a program operation, each program-verify iteration comprising a program portion and a verify portion; applying an initial voltage to a bit line associated with the non-volatile storage element during the program portion of each of the one or more program-verify iterations; and detecting when the non-volatile storage element passes a first verify test of one of the verify portions of the one or more program-verify iterations. The method further includes, in response to the detecting when the non-volatile storage element passes the first verify test: performing a first next program-verify iteration of the program operation, the first next program-verify iteration comprising a program portion and a verify portion; applying a first stepped up voltage to the bit line during the program portion of the first next program-verify iteration; performing a second next program-verify iteration of the program operation, the second next program-verify iteration comprising a program portion and a verify portion; and applying a second stepped up voltage to the bit line during the program portion of the second next program-verify iteration, where the initial voltage, the first stepped up voltage and the second stepped up voltage allow programming of the non-volatile storage element.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for programming in a non-volatile storage device, comprising:
   in a program operation, applying a plurality of program pulses to a word line, the word line is connected to a plurality of non-volatile storage elements, wherein each non-volatile storage element of the plurality of non-volatile storage elements is to be programmed to a respective target data state among a plurality of target data states and is associated with a respective bit line among a plurality of bit lines;
   during the program operation, for each non-volatile storage element of the plurality of non-volatile storage elements, determining when a threshold voltage of the non-volatile storage element exceeds a lower verify level of the respective target data state and maintaining a respective count of a number of program pulses which are subsequently applied to the non-volatile storage element while a threshold voltage of the non-volatile storage element has not yet been verified to have exceeded a lockout verify level of the respective target data state; and
   for each non-volatile storage element of the plurality of non-volatile storage elements, setting a voltage of the respective bit line at one or more stepped up levels as a function of the respective count, the one or more stepped up levels are stepped up from an initial level and allow programming of the non-volatile storage element.

2. The method of claim 1, wherein:
   the initial level allows programming of each non-volatile storage element of the plurality of non-volatile storage elements and is common for each non-volatile storage element of the plurality of non-volatile storage elements.

3. The method of claim 2, wherein:
   the initial level is 0 V.

4. The method of claim 1, wherein:
   the program operation comprises a plurality of program-verify iterations; and
   threshold voltages of different non-volatile storage elements of the plurality of non-volatile storage elements which have a common target data state of the plurality of target data states exceed a lower verify level of the common target data state at different program-verify iterations of the plurality of program-verify iterations.

5. The method of claim 1, wherein:
   the program operation comprises a plurality of program-verify iterations; and
   threshold voltages of different non-volatile storage elements of the plurality of non-volatile storage elements which have different target data states of the plurality of target data states exceed lower verify levels of the different target data states at different program-verify iterations of the plurality of program-verify iterations.

6. The method of claim 1, wherein:
   for at least one non-volatile storage element of the plurality of non-volatile storage elements, the voltage of the respective bit line is stepped up in at least two program pulses of the program pulses which are subsequently applied to the non-volatile storage.

7. The method of claim 1, wherein:
   for at least one non-volatile storage element of the plurality of non-volatile storage elements, the voltage of the respective bit line is stepped up in at least three program pulses.

8. The method of claim 1, wherein for each non-volatile storage element of the plurality of non-volatile storage elements:
   the respective count is maintained by storing data in a respective set of latches, each respective set of latches stores at least two bits of data to maintain the respective count; and
   the respective set of latches is read before each program pulse of the program pulses which are subsequently applied to the non-volatile storage element to determine the count.

9. A non-volatile storage system, comprising:
   a plurality of non-volatile storage elements connected to a word line, each non-volatile storage element of the plurality of non-volatile storage elements is to be programmed to a respective target data state among a plurality of target data states;
   a respective bit line associated with each non-volatile storage element; and a control circuit, the control circuit is configured to, in a program operation:
   apply a plurality of program pulses to the word line,
   for each non-volatile storage element of the plurality of non-volatile storage elements, determine when a threshold voltage of the non-volatile storage element exceeds a lower verify level of the respective target data state and maintain a respective count of a number of program pulses which are subsequently applied to the non-volatile storage element before the non-volatile storage element reaches a lockout state, and
   for each non-volatile storage element of the plurality of non-volatile storage elements, set a voltage of the respective bit line at one or more stepped up levels as a function of the respective count, the one or more stepped up levels are stepped up from an initial level and allow programming of the non-volatile storage element.

10. The non-volatile storage system of claim 9, wherein:
for at least one non-volatile storage element of the plurality of non-volatile storage elements, the respective count is at least two program pulses.

11. The non-volatile storage system of claim 9, wherein:
for at least one non-volatile storage element of the plurality of non-volatile storage elements, the respective count is at least three program pulses.

12. The non-volatile storage system of claim 9, further comprising, for each non-volatile storage element of the plurality of non-volatile storage elements:
   a respective set of latches, wherein the respective count is maintained by storing data in the respective set of latches and each respective set of latches stores at least two bits of data to maintain the respective count.

13. A non-volatile storage system, comprising:
   a plurality of non-volatile storage elements connected to a word line, each non-volatile storage element of the plurality of non-volatile storage elements is to be programmed to a respective target data state among a plurality of target data states;
   a respective bit line associated with each non-volatile storage element;
   a respective set of latches associated with each non-volatile storage element; and
   a control circuit, the control circuit is configured to, in a program operation:
      apply a plurality of program pulses to the word line, and
      for each non-volatile storage element of the plurality of non-volatile storage elements, provide a fast programming mode, then a slow programming mode and then a lockout state, maintain a respective count of a number of program pulses which are applied to the non-volatile storage element in the slow programming mode and provide an adjustment of a voltage of the respective bit line based on the count during the slow programming mode.

14. The non-volatile storage system of claim 13, wherein for each non-volatile storage element of the plurality of non-volatile storage elements, each respective set of latches comprises a plurality of bits which:
   identify the respective target data state when the non-volatile storage element is in the slow programming mode and the fast programming mode,
   identify the count when the non-volatile storage element is in the slow programming mode, and
   indicate that the non-volatile storage element is in the lockout state, when the non-volatile storage element is in the lockout state.

15. The non-volatile storage system of claim 13, wherein:
for non-volatile storage elements of the plurality of non-volatile storage elements which are to be programmed to a lower target data state of the plurality of target data states, the respective sets of latches comprise a first bit combination which is used to identify the lower target data state; and
for respective sets of latches associated with each non-volatile storage element of the plurality of non-volatile storage elements which is to be programmed to a higher target data state of the plurality of target data states: a second bit combination identifies the higher target data state during the fast programming mode, and the first bit combination identifies the higher target data state during at least one program pulse of the slow programming mode.

16. The non-volatile storage system of claim 15, wherein:
for the respective sets of latches associated with the non-volatile storage elements which are to be programmed to the higher target data state: the second bit combination identifies the higher target data state during at least another program pulse of the slow programming mode.

17. The non-volatile storage system of claim 15, wherein:
the non-volatile storage elements which are to be programmed to the lower target data state are in the lockout state during the at least one program pulse of the slow programming mode for the non-volatile storage elements which are to be programmed to the higher target data state, so that the first bit combination is no longer needed to identify the lower target data state.

18. The non-volatile storage system of claim 13, wherein:
for at least one non-volatile storage element of the plurality of non-volatile storage elements, the voltage of the respective bit line has at least two different levels during the slow programming mode.

19. The non-volatile storage system of claim 13, wherein:
for at least one non-volatile storage element of the plurality of non-volatile storage elements, the respective count is at least two program pulses.

20. The non-volatile storage system of claim 13, wherein:
for at least one non-volatile storage element of the plurality of non-volatile storage elements, the respective count is at least three program pulses.

* * * * *